United States Patent
Iwasaki et al.

(10) Patent No.: US 12,243,612 B2
(45) Date of Patent: Mar. 4, 2025

(54) MEMORY SYSTEM WITH MULTIPLE WIRING BOARDS WITH MULTIPLE PROJECTING PARTS AND RECESSED PARTS

(71) Applicant: Kioxia Corporation, Tokyo (JP)

(72) Inventors: Kenta Iwasaki, Hiratsuka Kanagawa (JP); Masayuki Kaga, Kamakura Kanagawa (JP); Katsuji Suzuki, Yokohama Kanagawa (JP); Tsuneyori Ino, Fujisawa Kanagawa (JP); Makoto Aoki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 111 days.

(21) Appl. No.: 18/163,521

(22) Filed: Feb. 2, 2023

(65) Prior Publication Data

US 2023/0410850 A1 Dec. 21, 2023

(51) Int. Cl.
G11C 5/06 (2006.01)
H01L 23/528 (2006.01)
H01L 25/16 (2023.01)

(52) U.S. Cl.
CPC ............ G11C 5/06 (2013.01); H01L 23/5283 (2013.01); H01L 25/165 (2013.01)

(58) Field of Classification Search
CPC ....... G11C 5/06; G11C 5/063; H01L 23/5283; H01L 25/165; H01L 25/105; H01L 25/18;
(Continued)

(56) References Cited

U.S. PATENT DOCUMENTS

2016/0270261 A1* 9/2016 Matsuda ............ G11B 33/1406
2016/0270265 A1* 9/2016 Yoshinaga ......... H05K 7/20727

FOREIGN PATENT DOCUMENTS

JP H01-208891 A 8/1989
JP H11-261186 A 9/1999
(Continued)

*Primary Examiner* — Sultana Begum
(74) *Attorney, Agent, or Firm* — FOLEY & LARDNER LLP

(57) ABSTRACT

A memory system includes: a first wiring board having first and second interconnections and a first side surface; a second wiring board having third and fourth interconnections and a second side surface; first and second projecting parts each provided at one of the first and second side surfaces; first and second recessed parts each provided at the other of the first and second side surfaces; and a memory and a memory controller mounted on the first and second wiring boards, respectively. The first and second projecting part are connected to one of the first and third interconnections and one of the second and fourth interconnections, respectively. The first and second recessed parts is connected to the other of the first and third interconnections and the other of the second and fourth interconnections, respectively. The first projecting part is engaged with the first recessed part to electrically connect the memory to the memory controller via the first and third interconnections. The second projecting part is engaged with the second recessed part to electrically connect the memory to the memory controller via the second and fourth interconnections.

20 Claims, 28 Drawing Sheets

(58) Field of Classification Search
CPC . H05K 2201/09036; H05K 2201/0919; H05K 2201/09845; H05K 2201/10159; H05K 1/142

See application file for complete search history.

(56) References Cited

FOREIGN PATENT DOCUMENTS

| | | |
|---|---|---|
| JP | 2013-197455 A | 9/2013 |
| JP | 2019-149489 A | 9/2019 |

* cited by examiner

MEMORY SYSTEM WITH MULTIPLE WIRING BOARDS WITH MULTIPLE PROJECTING PARTS AND RECESSED PARTS

CROSS-REFERENCE TO RELATED APPLICATION(S)

This application is based upon and claims the benefit of priority from Japanese Patent Application No. 2022-096550, filed Jun. 15, 2022, the entire contents of which are incorporated herein by reference.

FIELD

Embodiments described herein relate generally to a memory system and a wiring board.

BACKGROUND

A memory system having a memory and a controller mounted on a wiring board has recently been known. In such a memory system, electronic components such as a memory and a controller are mounted on a wiring board via connection members such as solders. As the function and performance of the memory system improve, the number of electronic components mounted on the wiring board may increase and the areas of the wiring board may decrease. That is, the mounting area of the electronic components on the wiring board is often restricted. Furthermore, the memory and the controller mounted on the wiring board are often detached from the wiring board for repair and analysis. Connection members are heated and melted to detach the electronic components such as the memory and the controller from the wiring board. This heating results in the application of thermal stress to the electronic components.

DETAILED DESCRIPTION

Figure 1:
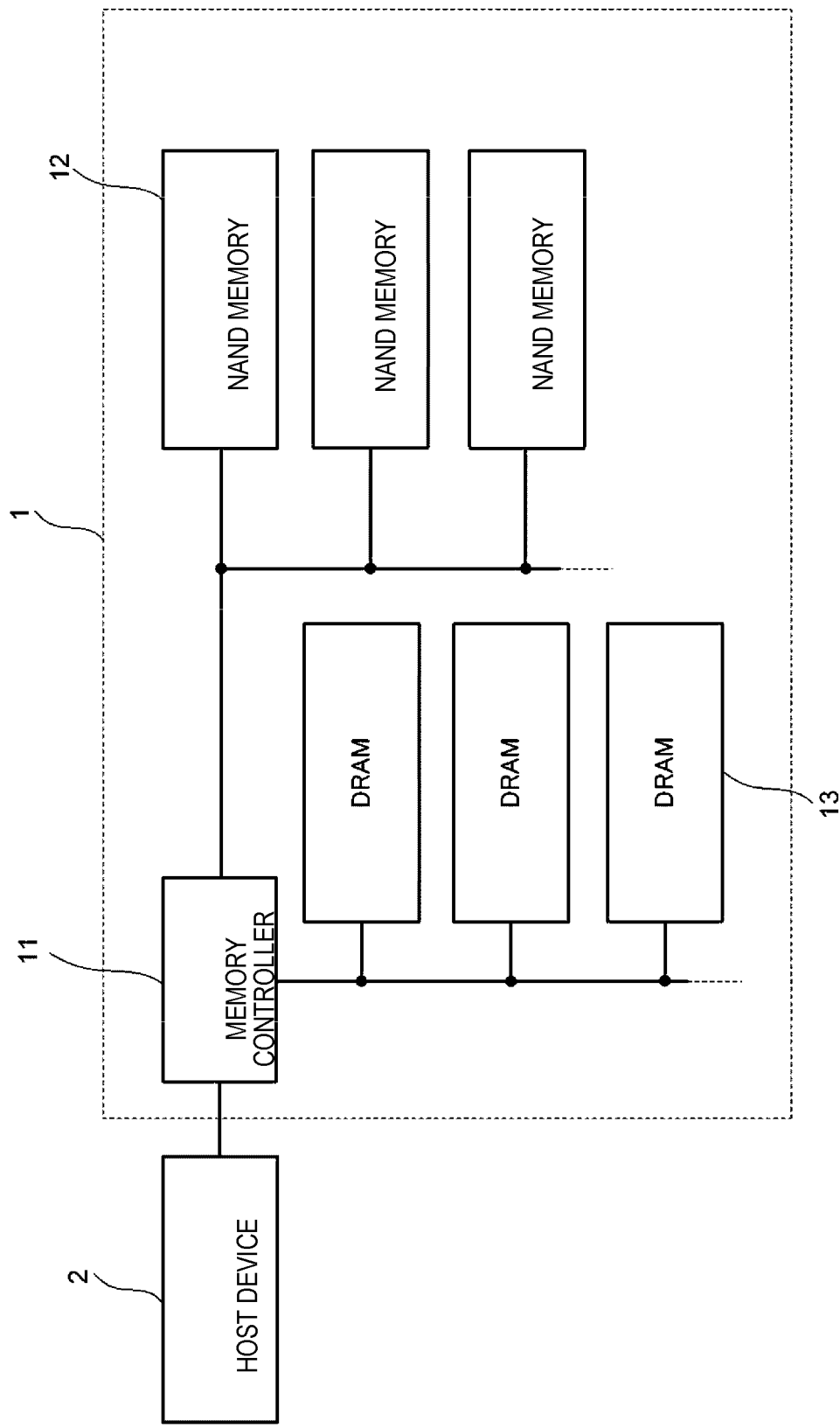
FIG. 1 is a block diagram illustrating a configuration example of a memory system.

At least one embodiment provides a memory system and a wiring board capable of suitably mounting electronic components.

In general, according to at least one embodiment, a memory system includes: a first wiring board having a first interconnection, a second interconnection, and a first side surface; a second wiring board having a third interconnection, a fourth interconnection, and a second side surface; a first projecting part and a second projecting part each provided at one of the first side surface and the second side surface independently; a first recessed part and a second recessed part each provided at the other of the first side surface and the second side surface; a memory mounted on the first wiring board and electrically connected to the first interconnection and the second interconnection; and a memory controller mounted on the second wiring board and electrically connected to the third interconnection and the fourth interconnection. The first projecting part is connected to one of the first interconnection and the third interconnection. The second projecting part is connected to one of the second interconnection and the fourth interconnection. The first recessed part is connected to the other of the first interconnection and the third interconnection. The second recessed part is connected to the other of the second interconnection and the fourth interconnection. The first projecting part is engaged with the first recessed part to electrically connect the memory to the memory controller via the first interconnection and the third interconnection. The second projecting part is engaged with the second recessed part to electrically connect the memory to the memory controller via the second interconnection and the fourth interconnection.

Hereinafter, embodiments will be described with reference to the drawings. A relation between a thickness and a planar dimension of each component illustrated in the drawings, a ratio of the thickness of each component, and the like may be different from those of an actual product. In addition, in the embodiments, substantially the same components are denoted by the same reference signs, and descriptions are appropriately omitted or simplified.

In the present embodiments, "connect/connection" encompasses not only structurally connect/structural connection but also electrically connect/electrical connection.

Configuration Example of Memory System

FIG. 1 is a block diagram illustrating a configuration example of a memory system 1 according to the present embodiment. The memory system 1 is configured to be connectable to a host device 2.

The memory system 1 includes a storage device such as a solid state drive (SSD). The storage device is available to various types of electronic apparatuses such as a personal computer, a smartphone, and a tablet device.

The host device 2 functions to control the memory system 1. Examples of the host device 2 include a server and a personal computer.

The memory system 1 includes a memory controller 11, NAND memories 12, and dynamic random access memories (DRAM) 13. The memory system 1 is formed by connecting a plurality of wiring boards on which electronic components such as the memory controller 11, the NAND memories 12, or the DRAMs 13 are respectively mounted. Configurations of the plurality of wiring boards will be described later.

The memory controller 11 controls the execution of operations such as write, read, and erasure of data from/to the NAND memories 12 and the DRAMs 13 on the basis of, for example, an access request from the host device 2. The memory controller 11 is an example of the electronic component. The memory controller 11 is a semiconductor device configured as, for example, an SoC.

The NAND memory 12 is a NAND flash memory. The NAND memory 12 stores data in a non-volatile manner. While FIG. 1 illustrates three NAND memories 12, the number of the NAND memories 12 is not limited to three. The NAND memory 12 is an example of the electronic component.

The DRAM 13 temporarily stores, for example, data that is received from the host device 2 and that is not written yet to the NAND memory 12 and data that is read from the NAND memory 12 and that is not transmitted yet to the host device 2. While FIG. 1 illustrates the three DRAMs 13, the number of the DRAMs 13 is not limited to three. The DRAM 13 is an example of the electronic component.

Configuration Example of Wiring Board

Figure 2:
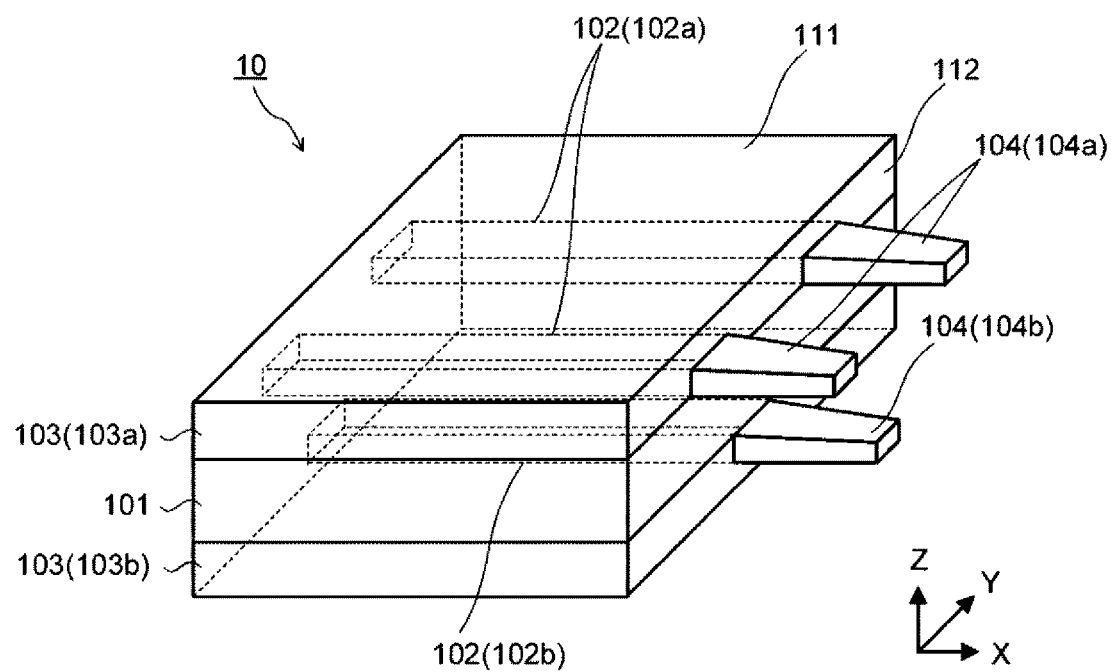
FIG. 2 is a perspective view illustrating a structural example of part of a wiring board available to the memory system.
Figure 3:
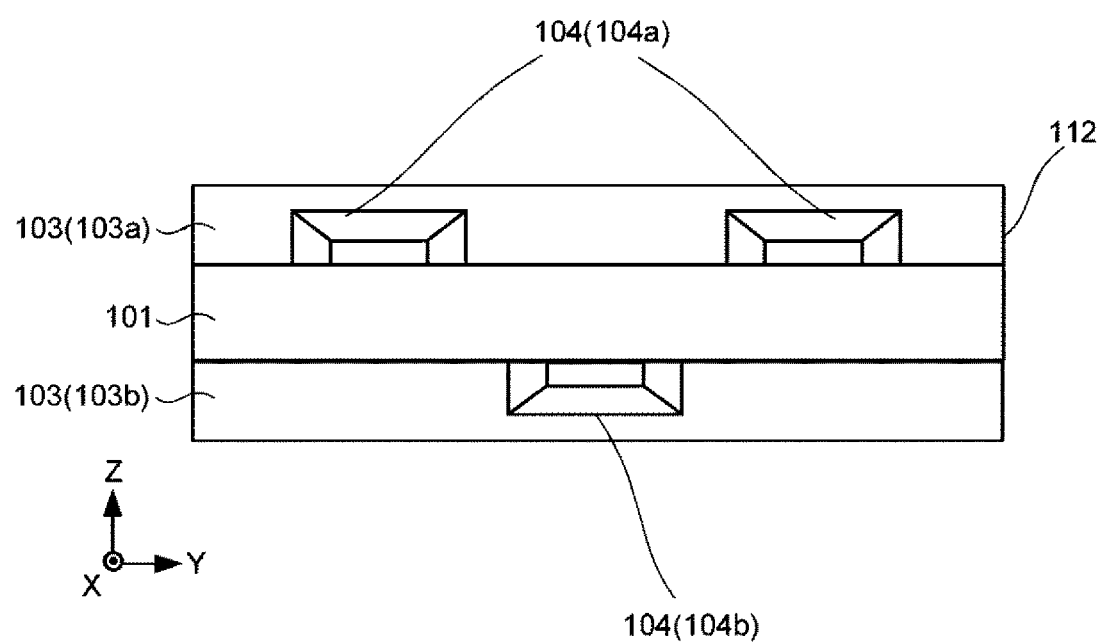
FIG. 3 is a schematic diagram illustrating a side surface of the wiring board illustrated in FIG. 2 from an X-axis direction.
Figure 4:
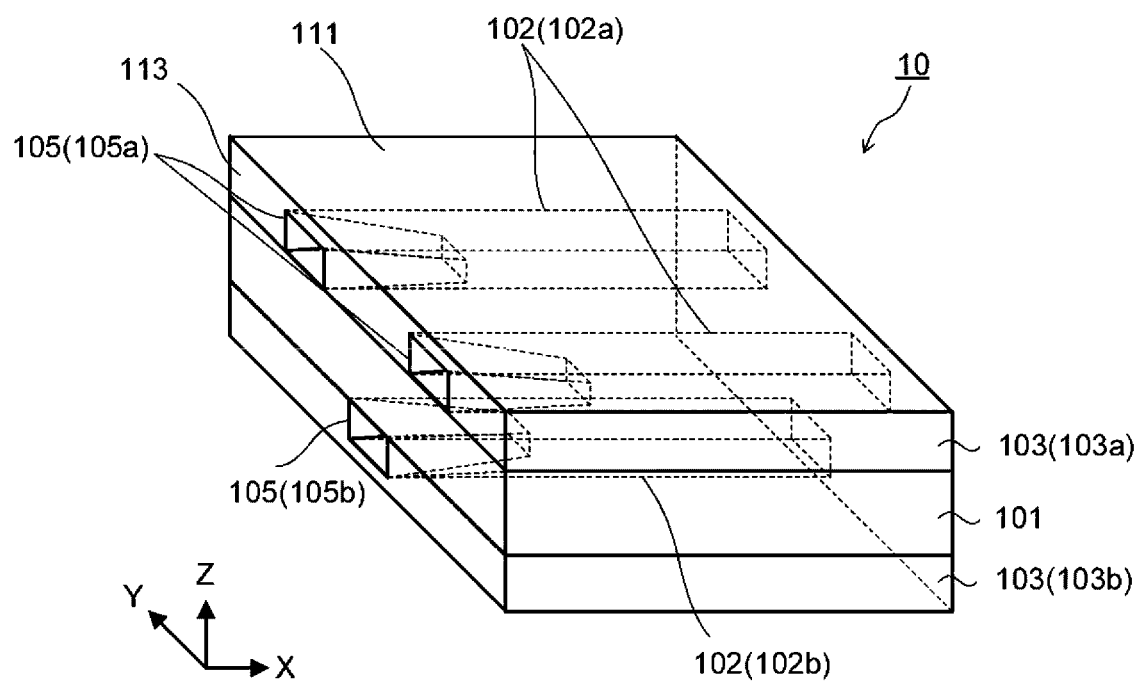
FIG. 4 is a perspective view illustrating another structural example of part of the wiring board.
Figure 5:
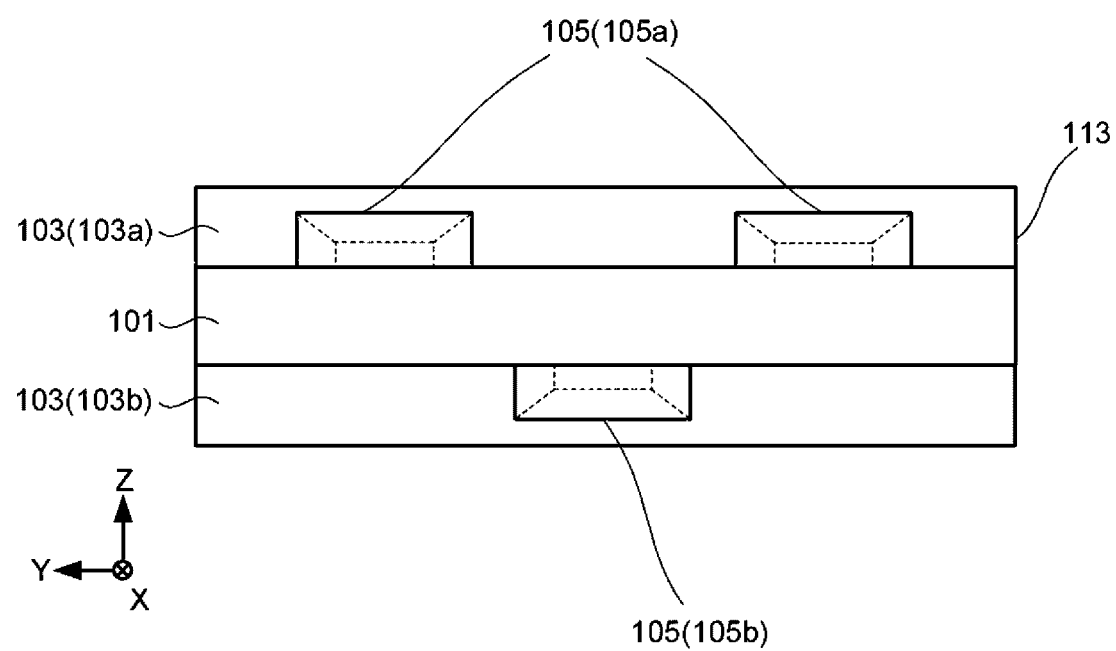
FIG. 5 is a schematic diagram illustrating a side surface of the wiring board illustrated in FIG. 4 from the X-axis direction.

A wiring board 10 available to the memory system 1 will be described. For example, the wiring board 10 is a printed wiring board (PWB). FIG. 2 is a perspective view illustrating a structural example of part of the wiring board 10. FIG. 3 is a schematic diagram illustrating a side surface of the wiring board 10 illustrated in FIG. 2 from an X-axis direction. FIG. 4 is a perspective view illustrating a structural example of another part of the wiring board 10. FIG. 5 is a schematic diagram illustrating a side surface of the wiring board 10 illustrated in FIG. 4 from the X-axis direction. As illustrated in FIGS. 2 to 5, an X axis, a Y axis perpendicular to the X axis, and a Z axis perpendicular to the X and Y axes are defined. The Z axis is identical to a thickness direction of the wiring board 10.

As illustrated in FIGS. 2 to 5, the wiring board 10 has an insulating base material 101, interconnection layers 102, insulating layers 103, and at least either projecting parts 104 or recessed parts 105. The wiring board 10 may have both the projecting parts 104 and the recessed parts 105.

The wiring board 10 has an external surface 111 and at least one of a side surface 112 or 113. The external surface 111 is a surface on which the electronic components such as the memory controller 11, the NAND memories 12, or the DRAMs 13 are mounted. These electronic components are mounted on the external surface 111 via connection members such as solders. The side surface 112 and the side surface 113 are each a surface contacting the other wiring board 10 when one wiring board 10 is fitted into the other wiring board 10.

The insulating base material 101 contains an insulating material, e.g., a glass cloth. The material of the insulating base material 101 is not limited to the glass cloth. For example, the other insulating material such as a glass substrate, a ceramic substrate, a glass epoxy substrate, or a prepreg may be used for the insulating base material 101. The insulating base material 101 has a first surface and a second surface.

The interconnection layers 102 are each provided on the first or second surface of the insulating base material 101. The interconnection layers 102 each include connection pads, not illustrated, exposed to the external surface 111 of the wiring board 10. FIGS. 2 to 5 illustrate interconnection layers 102a provided on the first surface of the insulating base material 101 and an interconnection layer 102b provided on the second surface of the insulating base material 101. The interconnection layers 102a can be electrically connected to the electronic components, e.g., the memory controller 11, the NAND memories 12, and the DRAMs 13 via the connection pads of the external surface 111. The interconnection layer 102b is electrically connected to the electronic components via the connection pads of the external surface 111 through via penetrating the insulating base material 101. FIGS. 2 to 5 illustrate an example of the wiring board 10 having multilayer interconnections such as the interconnection layers 102 provided on the first and second surfaces of the insulating base material 101. Locations of the interconnection layers 102 are not limited to these surfaces and the interconnection layers 102 may be provided on at least one surface of the insulating base material 101. In addition, a plurality of stacked structures each having the insulating base material 101 and the interconnection layer 102 may be provided via insulating layers. The interconnection layers 102 are formed using a metal material, e.g., copper.

The insulating layers 103 are provided on the first and second surfaces of the insulating base material 101 and cover the interconnection layers 102. The insulating layers 103 are formed using, for example, a solder resist. FIGS. 2 to 5 illustrate an insulating layer 103a provided on the first surface of the insulating base material 101 and an insulating layer 103b provided on the second surface of the insulating base material 101. Locations of the insulating layers 103 are not limited to these surfaces and the insulating layers 103 may be provided on at least one surface of the insulating base material 101.

The projecting parts 104 are provided at the side surface 112 of the wiring board 10 and extend from the interconnection layers 102 in, for example, an X-axis direction. FIGS. 2 and 3 illustrate two projecting parts 104a extending from the interconnection layer 102a and one projecting part 104b extending from the interconnection layer 102b. The projecting parts 104a and the projecting part 104b are provided at different layers, i.e., different positions in a Z-axis direction. The number of the projecting parts 104a is not limited to two and the number of the projecting parts 104b is not limited to one. The numbers of the projecting parts 104a and the projecting parts 104b may be set in response to the numbers of the interconnection layers 102a and the interconnection layers 102b. The projecting parts 104 are formed using the same material as the interconnection layer 102. While the projecting parts 104 have a shape tapered along the X-axis direction in FIGS. 2 and 3, the shape of the projecting parts 104 is not limited to that illustrated in FIGS. 2 and 3.

The recessed parts 105 are provided near the side surface 113 of the wiring board 10 and face the interconnection layers 102. The recessed parts 105 extend, for example, from the side surface 113 to the interconnection layers 102 along the X-axis direction. It is preferable that a width (length) in a Y-axis direction and a width (length) in the Z-axis direction of the recessed parts 105 are larger than, for example, a width (length) in the Y-axis direction and a width (length) in the Z-axis direction of the corresponding projecting parts 104. FIGS. 4 and 5 illustrate two recessed parts 105a facing the interconnection layers 102a and one recessed part 105b facing the interconnection layer 102b. The recessed parts 105a and the recessed part 105b are provided at different layers, i.e., different positions in the Z-axis direction. The number of the recessed parts 105a is not limited to two and the number of the recessed parts 105b is not limited to one. The numbers of the recessed parts 105a and the recessed parts 105b may be set in response to the numbers of the interconnection layers 102a and the interconnection layers 102b. In addition, the numbers of the recessed parts 105a and the recessed parts 105b may be set in response to the numbers of the corresponding projecting parts 104. While the recessed parts 105 have a shape tapered along the X-axis direction in FIGS. 4 and 5, the shape of the recessed parts 105 is not limited to that illustrated in FIGS. 4 and 5 if the projecting parts 104 can be fitted into the recessed parts 105.

The memory system 1 according to at least one embodiment includes a plurality of wiring boards 10 on which the electronic components such as the memory controller 11, the NAND memories 12, or the DRAMs 13 are mounted. The projecting parts 104 provided at one wiring board 10 are fitted into the recessed parts 105 provided at the other wiring board 10 among the plurality of wiring boards 10. The interconnections on the plurality of wiring boards 10 can be thereby electrically connected.

First Structural Example of Memory System 1

Figure 6:
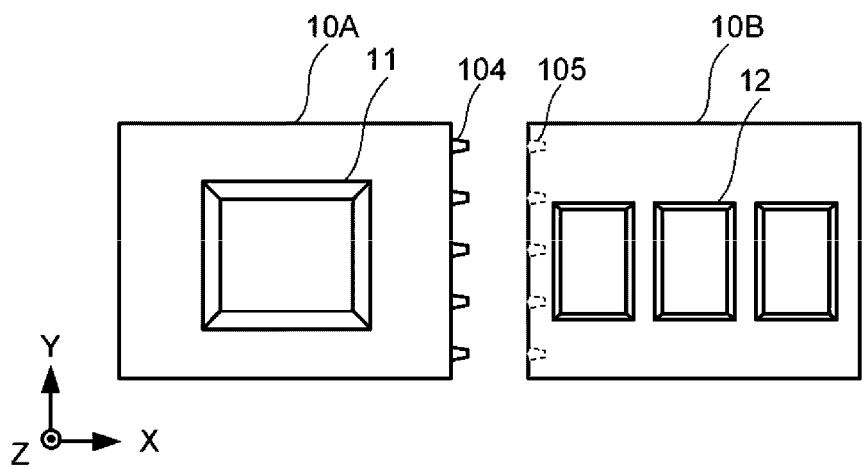
FIG. 6 is a schematic diagram illustrating a first structural example of the memory system.
Figure 7:
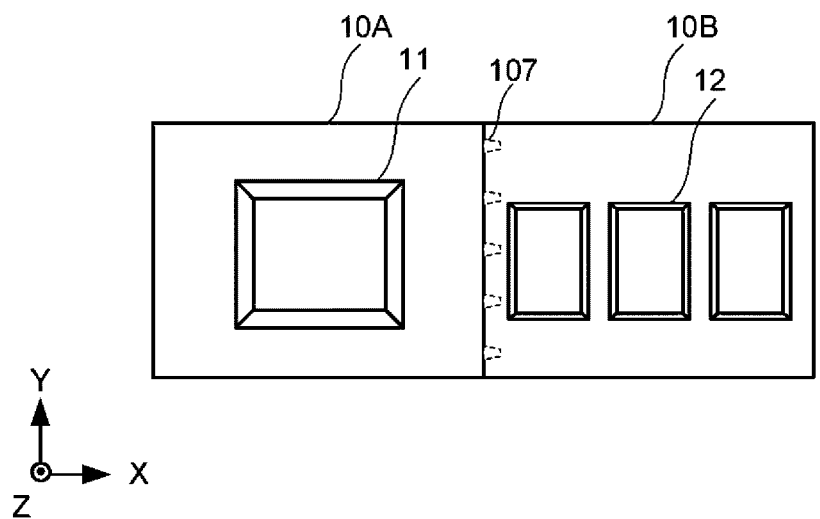
FIG. 7 is a schematic diagram illustrating the first structural example of the memory system.
Figure 8:
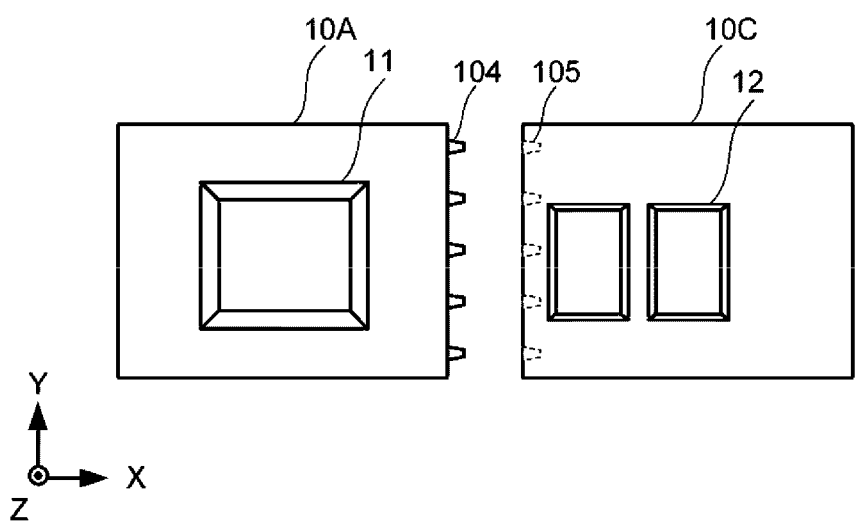
FIG. 8 is a schematic diagram illustrating the first structural example of the memory system.

FIGS. 6, 7, and 8 are schematic diagrams illustrating a first structural example of the memory system 1. The first structural example of the memory system 1 has the wiring board 10 (10A) on which the memory controller 11 is mounted and the wiring board 10 (10B) on which the NAND memories 12 are mounted. The number of the wiring boards 10 is not limited to two. The first structural example of the memory system 1 may also have the wiring board 10 on which the dynamic random access memories (DRAMs) 13 are mounted.

As illustrated in FIG. 6, the wiring board 10A has a plurality of projecting parts 104. The memory controller 11 is electrically connected to the interconnection layers 102 illustrated in, for example, FIGS. 2 and 3.

As illustrated in FIG. 6, the wiring board 10B has a plurality of recessed parts 105. The NAND memories 12 are electrically connected to the interconnection layers 102 illustrated in, for example, FIGS. 4 and 5.

The projecting parts 104 of the wiring board 10A are fitted into the recessed parts 105 of the wiring board 10B to form joint parts 107, as illustrated in FIG. 7. The joint parts 107 can electrically connect the interconnection layers 102 of the wiring board 10A to the interconnection layers 102 of the wiring board 10B.

FIG. 6 illustrates the example in which the wiring board has the projecting parts 104 and the wiring board 10B has the recessed parts 105. The disclosure is not limited to this example, and the wiring board 10A may have the recessed parts 105 and the wiring board 10B may have the projecting parts 104.

As a comparative example of connecting a plurality of wiring boards, there is a connection method by, for example, overlapping parts of the external surfaces of the plurality of wiring boards. With this method, electronic components cannot be mounted in portions where the external surfaces of the plurality of wiring boards overlap, resulting in a smaller mounting area of the electronic components on each wiring board. On the other hand, according to the first structural example of the memory system 1, the plurality of wiring boards 10 are connected by facing the side surfaces of the wiring boards 10. Therefore, it is possible to prevent a reduction in the mounting area of the electronic components on each wiring board 10. Furthermore, in the memory system 1 according to the embodiment, the plurality of wiring boards 10 can be connected without connectors.

Moreover, it is known that when a plurality of electronic components are mounted on one wiring board and then part of the mounted electronic components are replaced, the wiring board is heated to melt solders and the electronic components to be replaced are separated from the wiring board. In this case, the electronic components mounted on the wiring board and unnecessary to be replaced are also heated, which may result in degradation of the electronic components unnecessary to be replaced. By contrast, according to the first structural example of the memory system 1, the wiring board 10 on which the electronic components to be replaced are mounted can be easily separated from the other wiring boards 10. In addition, only the wiring board 10 on which the electronic components to be replaced are mounted can be heated, thus preventing the degradation in the electronic components unnecessary to be replaced.

Furthermore, according to the first structural example of the memory system 1, the wiring board 10A can be separated from the wiring board 10B. The wiring board 10B can be replaced by another wiring board 10C different from the wiring board in the number of mounted NAND memories 12, as illustrated in FIG. 8. Even in this case, the projecting parts 104 of the wiring board 10A can be fitted into the recessed parts 105 of the wiring board 10C. Therefore, it is possible to provide the memory system 1 capable of reusing the wiring board 10A without replacement. For example, the multifunctional memory system 1 grows in size, increasing design and manufacturing costs. When a storage capacity of such a memory system 1 is changed, one wiring board 10 is replaced by the other wiring board 10 on which memories, e.g., NAND memories 12 having a different storage capacity are mounted and the wiring board on which the memory controller 11 is mounted can be still used without replacement. This can reduce design processes accompanied by a product change in the memory system 1.

Second Structural Example of Memory System 1

Figure 9:
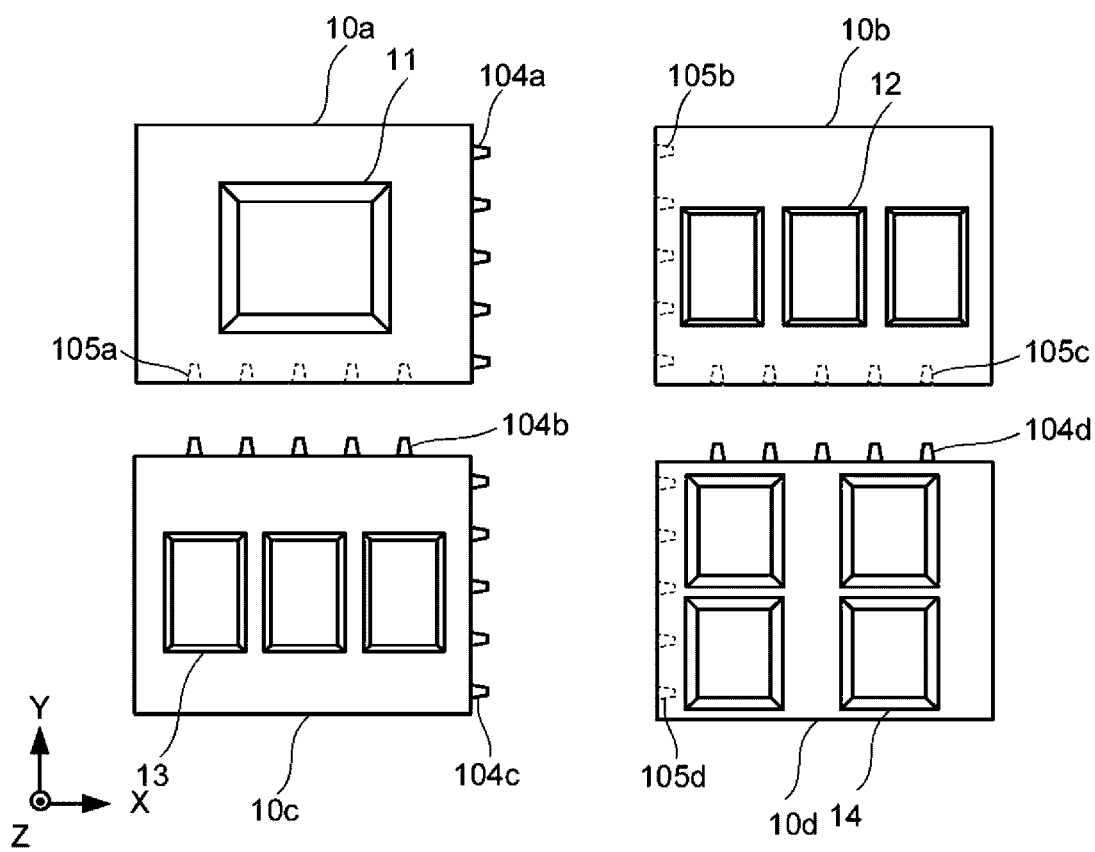
FIG. 9 is a schematic diagram illustrating a second structural example of the memory system.
Figure 10:
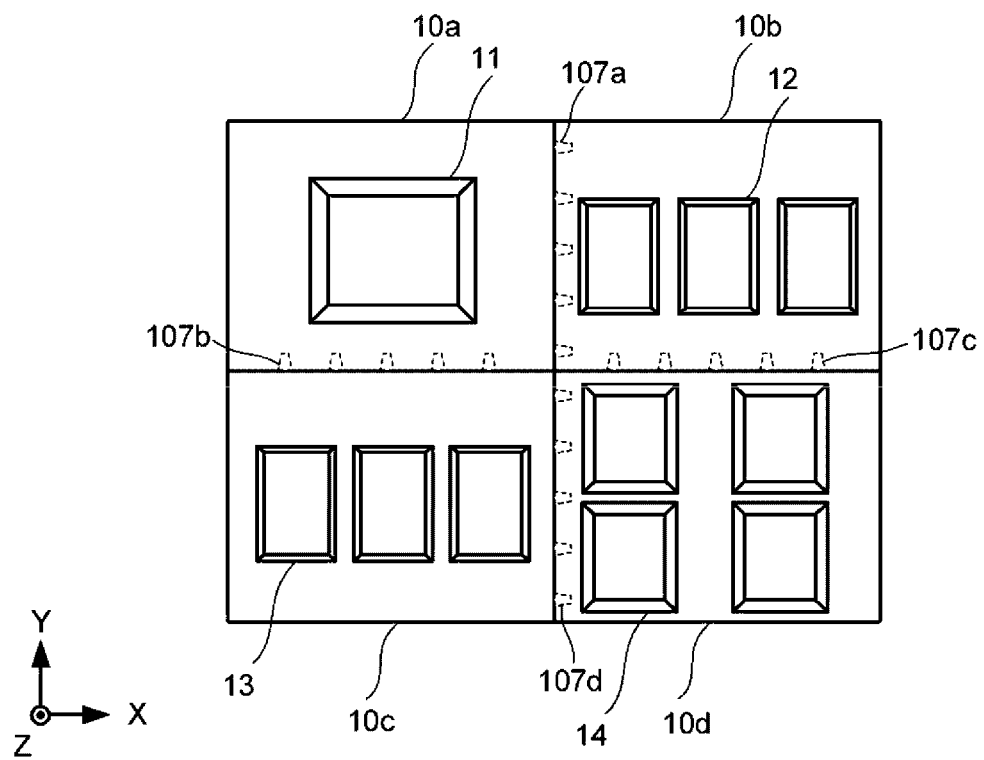
FIG. 10 is a schematic diagram illustrating the second structural example of the memory system.
Figure 11:
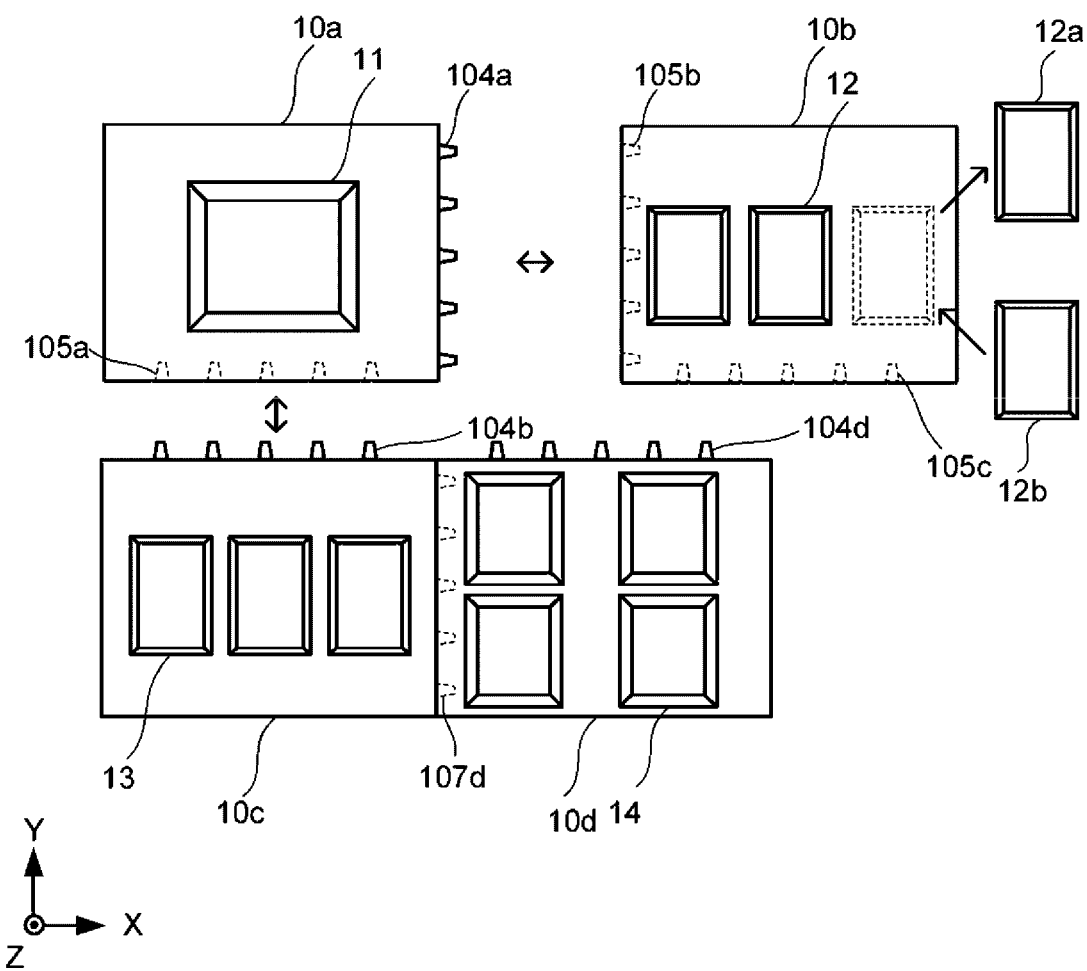
FIG. 11 is a schematic diagram illustrating the second structural example of the memory system.

FIGS. 9, 10, and 11 are schematic diagrams illustrating a second structural example of the memory system 1. The second structural example of the memory system 1 has the wiring board (10a) on which the memory controller 11 is mounted, the wiring board 10 (10b) on which the NAND memories 12 are mounted, the wiring board 10 (10c) on which the DRAMs 13 are mounted, and the wiring board 10 (10d) on which electronic components 14 are mounted. The number of the plurality of wiring boards is not limited to four. In addition, different wiring boards 10 may be used by types of electronic components provided in the memory system 1.

As illustrated in FIG. 9, the wiring board 10a has a plurality of projecting parts 104a and a plurality of recessed parts 105a. The projecting parts 104a and the recessed parts 105a are provided at different side surfaces of the wiring board 10a. The memory controller 11 is electrically connected to the interconnection layers 102 of the wiring board 10a.

As illustrated in FIG. 9, the wiring board 10b has a plurality of recessed parts 105b and a plurality of recessed parts 105c. The recessed parts 105b and the recessed parts 105c are provided at different side surfaces of the wiring board 10b. The NAND memories 12 are electrically connected to the interconnection layers 102 of the wiring board 10b.

As illustrated in FIG. 9, the wiring board 10c has a plurality of projecting parts 104b and a plurality of projecting parts 104c. The projecting parts 104b and the projecting parts 104c are provided at different side surfaces of the wiring board 10c. The DRAMs 13 are electrically connected to the interconnection layers 102 of the wiring board 10c.

As illustrated in FIG. 9, the wiring board 10d has a plurality of projecting parts 104d and a plurality of recessed parts 105d. The projecting parts 104d and the recessed parts 105d are provided at different side surfaces of the wiring board 10d. The electronic components 14 are electrically connected to the interconnection layers 102 of the wiring board 10d. Examples of the electronic components 14 include a semiconductor integrated circuit device encapsulated with a package, a resistor, and a capacitor. While FIG. 9 illustrates four electronic components 14, the number of the electronic components 14 is not limited to four.

The projecting parts 104a of the wiring board 10a are fitted into the recessed parts 105b of the wiring board 10b to form joint parts 107a, as illustrated in FIG. 10. The joint parts 107a can electrically connect the interconnection layers 102 of the wiring board 10a to the interconnection layers 102 of the wiring board 10b.

The projecting part 104b of the wiring board 10c are fitted into the recessed parts 105a of the wiring board 10a to form joint parts 107b, as illustrated in FIG. 10. The joint parts 107b can electrically connect the interconnection layers 102 of the wiring board 10a to the interconnection layers 102 of the wiring board 10c.

The projecting parts 104d of the wiring board 10d are fitted into the recessed parts 105c of the wiring board 10b to form joint parts 107c, as illustrated in FIG. 10. The joint parts 107c can electrically connect the interconnection layers 102 of the wiring board 10b to the interconnection layers 102 of the wiring board 10d.

The projecting parts 104c of the wiring board 10c are fitted into the recessed parts 105d of the wiring board 10d to form joint parts 107d, as illustrated in FIG. 10. The joint parts 107d can electrically connect the interconnection layers 102 of the wiring board 10c to the interconnection layers 102 of the wiring board 10d.

While the example in which the wiring board 10a has the projecting parts 104a and the wiring board 10b has the recessed parts 105b is described, the disclosure is not limited to this example. The wiring board 10a may have the recessed parts 105b and the wiring board 10b may have the projecting parts 104a.

While the example in which the wiring board 10a has the recessed parts 105a and the wiring board 10c has the projecting parts 104b is described, the disclosure is not limited to this example. The wiring board 10a may have the projecting parts 104b and the wiring board 10c may have the recessed parts 105a.

While the example in which the wiring board 10b has the recessed parts 105c and the wiring board 10d has the projecting parts 104d is described, the disclosure is not limited to this example. The wiring board 10b may have the projecting parts 104d and the wiring board 10d may have the recessed parts 105c.

While the example in which the wiring board 10c has the projecting parts 104c and the wiring board 10d has the recessed parts 105d is described, the disclosure is not limited to this example. The wiring board 10c may have the recessed parts 105d and the wiring board 10d may have the projecting parts 104c.

According to the second structural example of the memory system 1, the plurality of wiring boards 10a to 10d are connected by facing the side surfaces of the wiring board 10a to 10d. Therefore, it is possible to prevent a reduction in the mounting area of the electronic components on each of the wiring boards 10a to 10d. Furthermore, according to the second structural example of the memory system 1, the plurality of wiring boards 10a to 10d can be connected without connectors.

Furthermore, according to the second structural example of the memory system 1, when some failure occurs, for example, to the NAND memories 12 mounted on the wiring board 10b, the wiring boards 10a, 10c, and 10d can be easily separated from the wiring board 10b as illustrated in FIG. 11. Subsequently, the wiring board 10b is heated to detach a NAND memory 12a necessary to be replaced, the NAND memory 12a is replaced by another NAND memory 12b, the wiring board 10a, the wiring board the wiring board 10c, and the wiring board 10d can be connected by refitting. This enables only the wiring board on which the component to be replaced is mounted to be separated from the other wiring boards and to be heated. Therefore, the degradation in the electronic components mounted on the other wiring boards and unnecessary to be replaced can be prevented.

Moreover, according to the second structural example of the memory system 1, even when the wiring board on which part of electronic components are mounted is replaced to accompany a change in specifications or the like, the wiring boards unnecessary to be replaced can be reused without replacement. Therefore, it is possible to eliminate several processes accompanying the change in specifications.

First Example of Method of Forming Projecting Parts 104

A first example of a method of forming the projecting parts 104 provided at the wiring board 10 will be described with reference to FIGS. 12A to 18B. These drawings are schematic diagrams illustrating the first example of the method of forming the projecting parts 104. FIGS. 12A, 13A, 14A, 15A, 16A, 17A, and 18A are schematic diagrams each illustrating an upper surface of part of the wiring board 10 in a view from the Z-axis direction. FIGS. 12B, 13B, 14B, 15B, 16B, 17B, and 18B are schematic diagrams each illustrating a side surface of the part of the wiring board 10 in a view from the Y-axis direction.

Figure 12A:
FIGS. 12A and 12B are schematic diagrams illustrating part of a first example of a method of forming projecting parts.
Figure 12B:
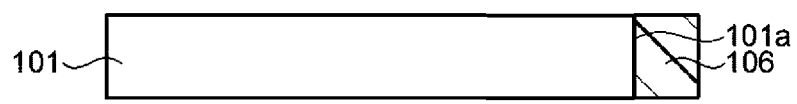

First, as illustrated in FIGS. 12A and 12B, a support material 106 is joined to a side surface 101a of the insulating base material 101. The support material 106 can be formed by, for example, a method of spraying a resin material to the side surface 101a or joining a resin material to the side surface 101a via an adhesive. The support material 106 may have insulating properties.

Figure 13A:
FIGS. 13A and 13B are schematic diagrams illustrating another part of the first example of the method of forming projecting parts.
Figure 13A:
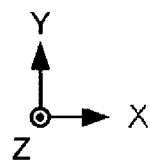
Figure 13B:
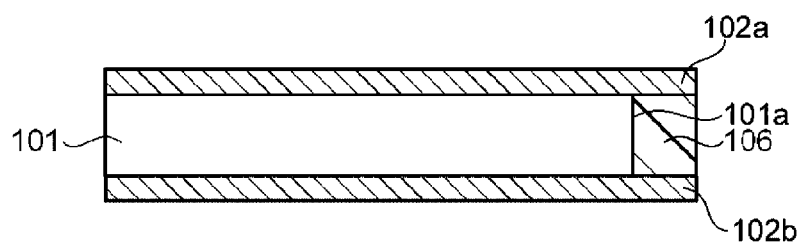
Figure 13B:
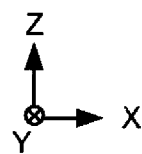

Next, as illustrated in FIGS. 13A and 13B, the interconnection layers 102 are formed on surfaces of at least either the insulating base material 101 or the support material 106. FIGS. 13A and 13B illustrate an example of forming the interconnection layer 102a on first surfaces of the insulating base material 101 and the support material 106 and forming the interconnection layer 102b on second surfaces opposite to the first surfaces. The interconnection layers 102 can be formed using a method of, for example, forming conductive materials such as copper plates on the surfaces of the insulating base material 101 and the support material 106.

Figure 14A:
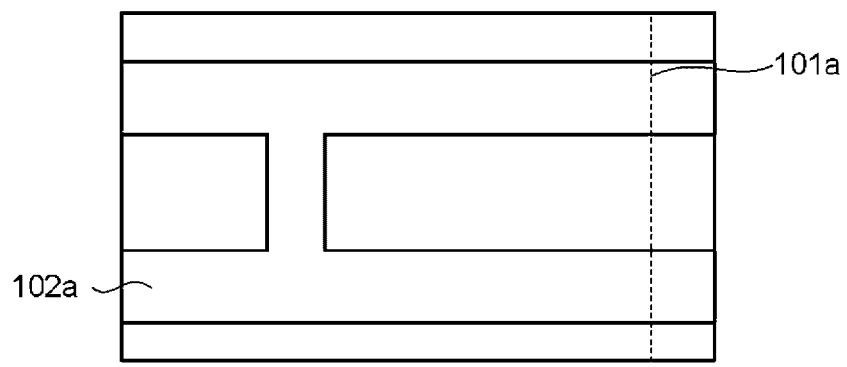
FIGS. 14A and 14B are schematic diagrams illustrating yet another part of the first example of the method of forming projecting parts.
Figure 14B:
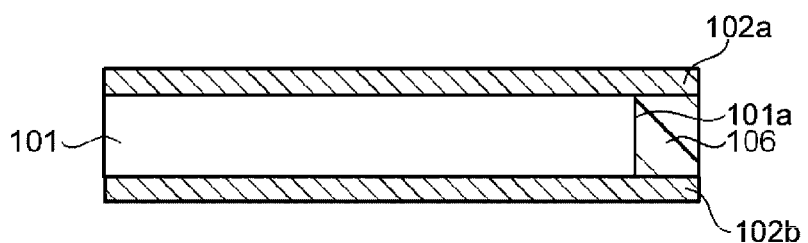

Next, as illustrated in FIGS. 14A and 14B, the interconnection layers 102 are worked to form an interconnection pattern. A shape of the interconnection pattern is not particularly limited. The interconnection patterns can be formed by, for example, partially removing the interconnection layers 102 using such a method as etching.

Figure 15A:
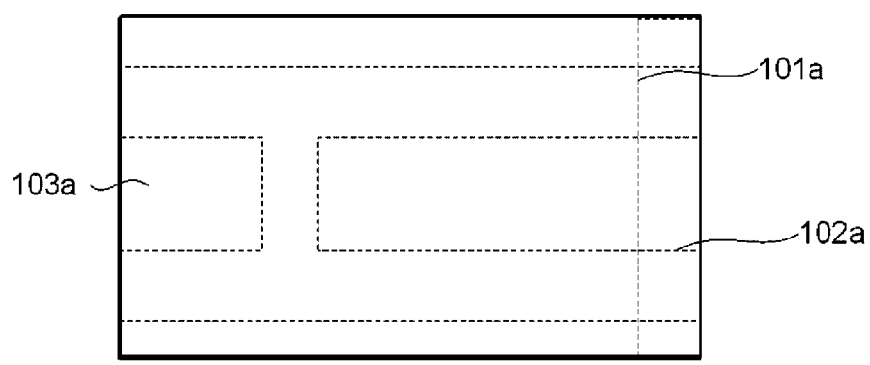
FIGS. 15A and 15B are schematic diagrams illustrating yet another part of the first example of the method of forming projecting parts.
Figure 15A:
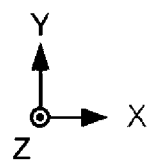
Figure 15B:
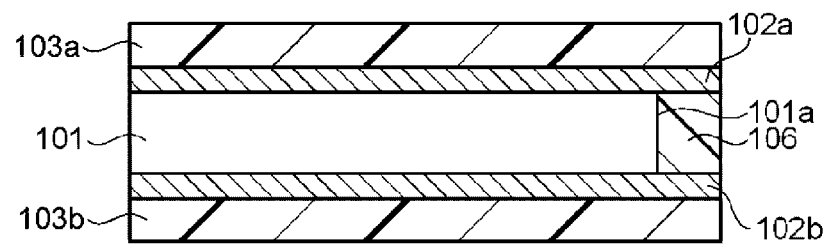
Figure 15B:
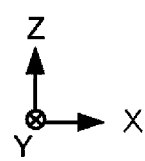

Next, as illustrated in FIGS. 15A and 15B, the insulating layers 103 are formed on the interconnection layers 102. FIGS. 15A and 15B illustrate an example of forming the insulating layer 103a on the interconnection layer 102a and the insulating layer 103b on the insulating layer 102b. The insulating layers 103 can be formed by coating insulating materials such as solder resists onto the interconnection layers 102 and hardening the insulating materials.

Figure 16A:
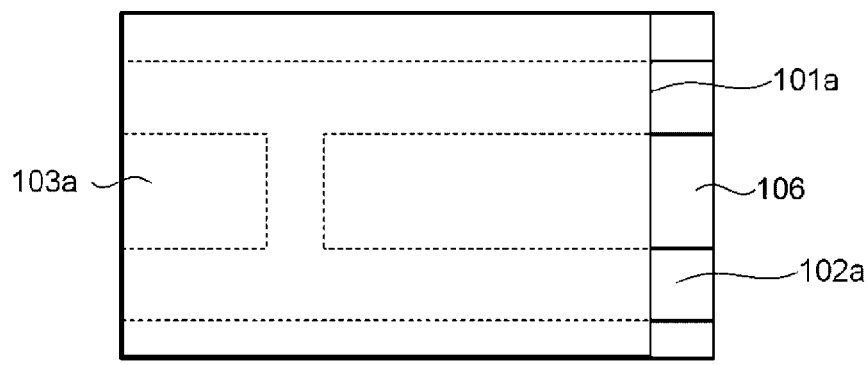
FIGS. 16A and 16B are schematic diagrams illustrating yet another part of the first example of the method of forming projecting parts.
Figure 16A:
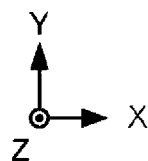
Figure 16B:
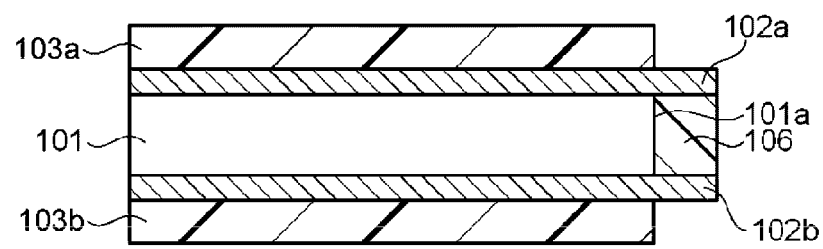
Figure 16B:
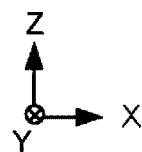

Next, as illustrated in FIGS. 16A and 16B, portions of the insulating layers 103 overlapping the support material 106 are removed to expose portions of the interconnection layers 102 overlapping the support material 106. The insulating layers 103 can be removed partially by such a method as etching. In a process of coating the insulating layers 103 onto the interconnection layers 102, the insulating layers 103 may be coated while avoiding the portions that may overlap the support material 106.

Figure 17A:
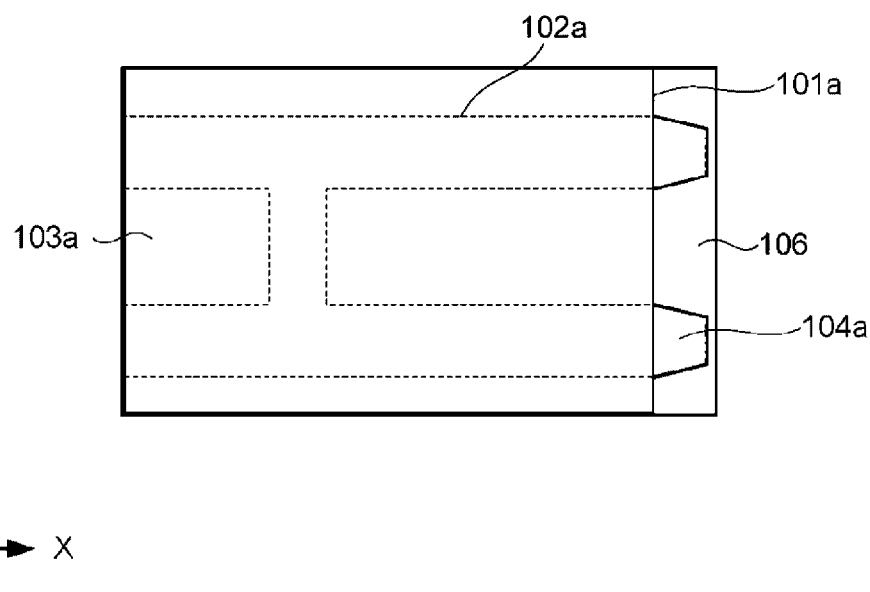
FIGS. 17A and 17B are schematic diagrams illustrating yet another part of the first example of the method of forming projecting parts.
Figure 17B:
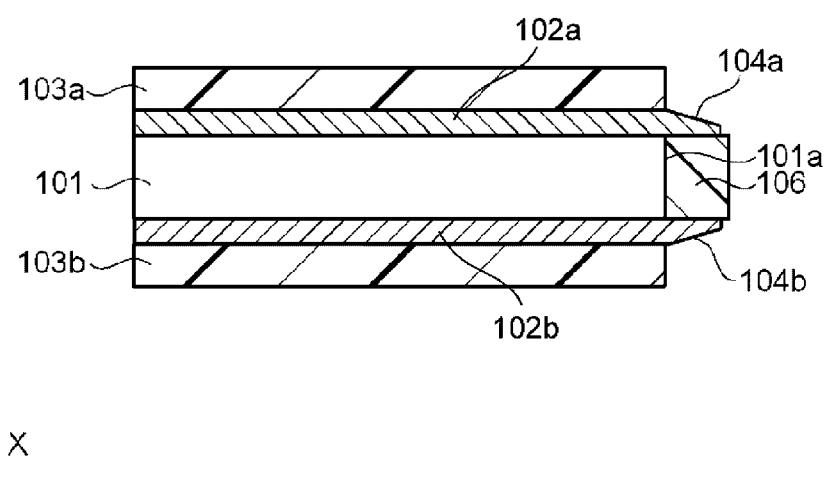

Next, as illustrated in FIGS. 17A and 17B, the exposed portions of the interconnection layers 102 are worked to form the projecting parts 104. FIGS. 17A and 17B illustrate an example of working the exposed portion of the interconnection layer 102a to form the projecting part 104a and working the exposed portion of the interconnection layer 102b to form the projecting part 104b. The projecting parts 104 can be formed by, for example, working the exposed portions of the interconnection layers 102 using electrolytic etching or strong acid etching with an etching solution such as nitric acid. Furthermore, the support material 106 remains.

Figure 18A:
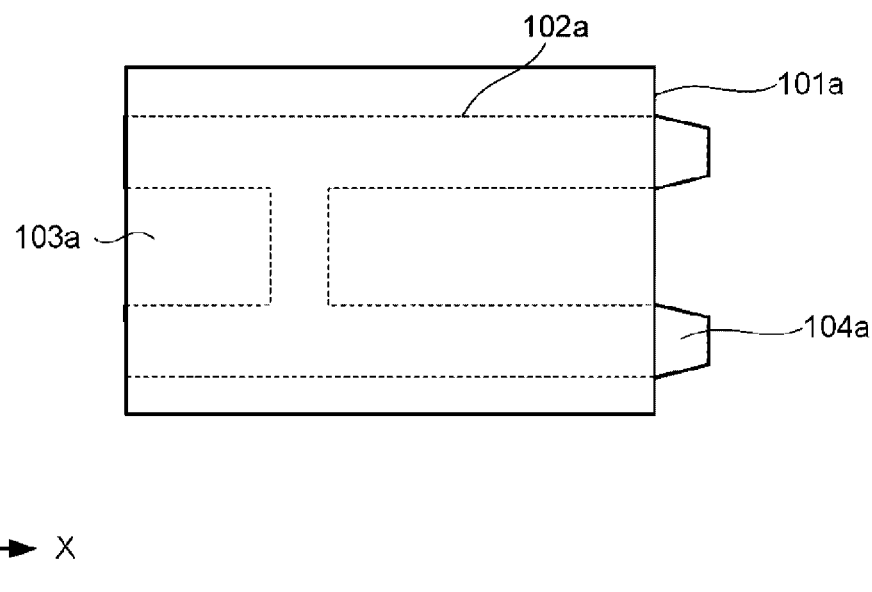
FIGS. 18A and 18B are schematic diagrams illustrating yet another part of the first example of the method of forming projecting parts.
Figure 18B:
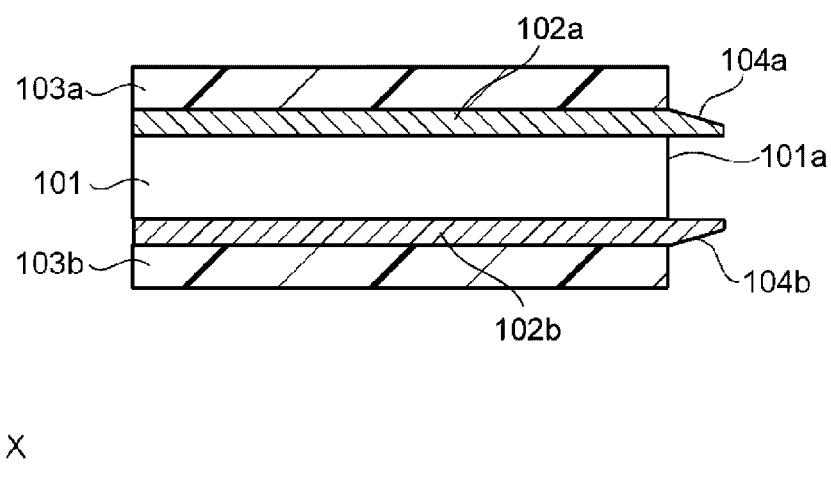

Next, as illustrated in FIGS. 18A and 18B, the support material 106 is removed. The support material 106 can be removed by, for example, being immersed in an organic solvent. The support material 106 may remain without removal. The above is the description of the first example of the method of forming the projecting parts 104.

Second Example of Method of Forming Projecting Parts 104

A second example of the method of forming the projecting parts 104 provided at the wiring board 10 will be described with reference to FIGS. 19A to 26B. These drawings are schematic diagrams illustrating the second example of the method of forming the projecting parts 104. FIGS. 19A, 20A, 21A, 22A, 23A, 24A, 25A, and 26A are schematic diagrams each illustrating the upper surface of part of the wiring board 10 in a view from the Z-axis direction. FIGS. 19B, 20B, 21B, 22B, 23B, 24B, 25B, and 26B are schematic diagrams each illustrating the side surface of the part of the wiring board 10 in a view from the Y-axis direction. An example of forming the projecting parts 104 provided at the plurality of wiring boards 10 in the same processes will be described herein.

Figure 19A:
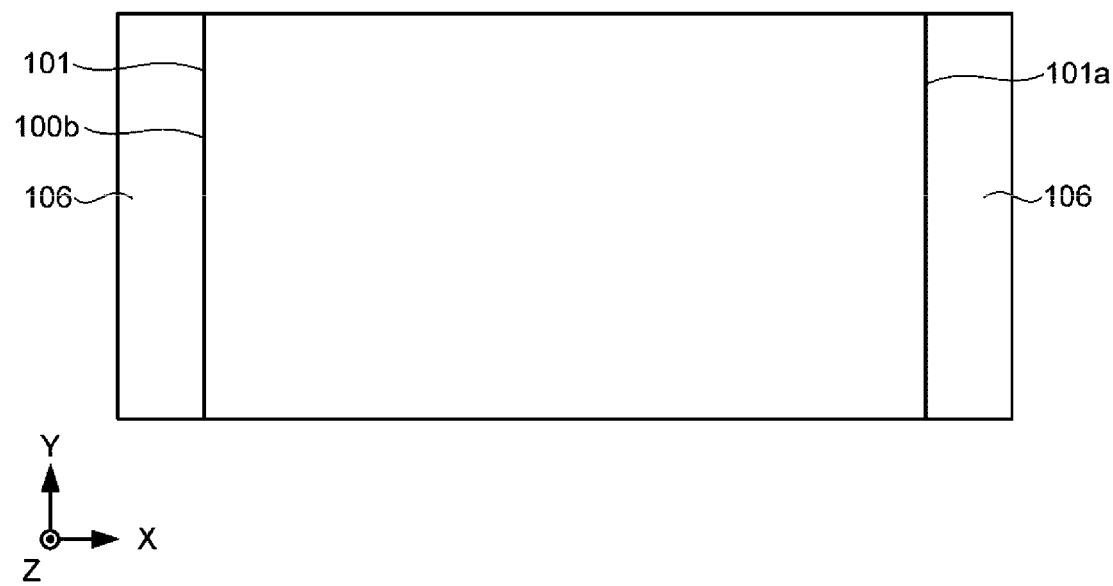
FIGS. 19A and 19B are schematic diagrams illustrating part of a second example of the method of forming projecting parts.
Figure 19B:
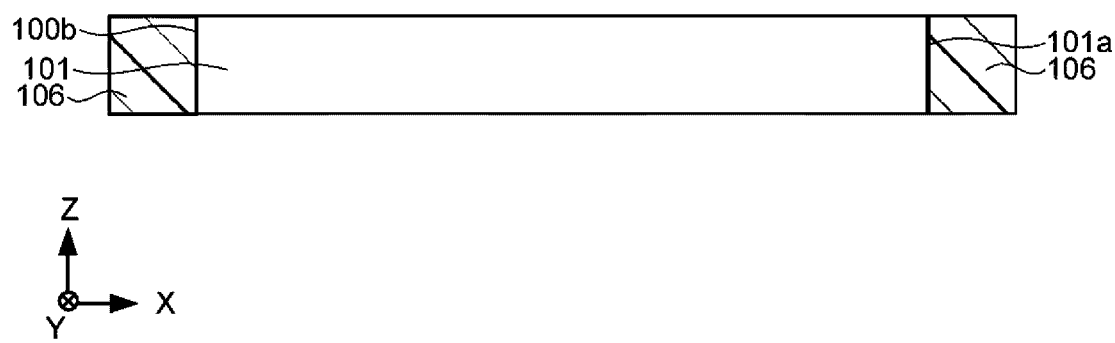

First, as illustrated in FIGS. 19A and 19B, the support materials 106 are joined to the side surfaces 101a and 101b of the insulating base material 101. The support materials 106 can be formed by, for example, the method of spraying resin material to the side surfaces 101a and 101b or joining resin materials to the side surfaces 101a and 101b via adhesives. The support material 106 may have insulating properties.

Figure 20A:
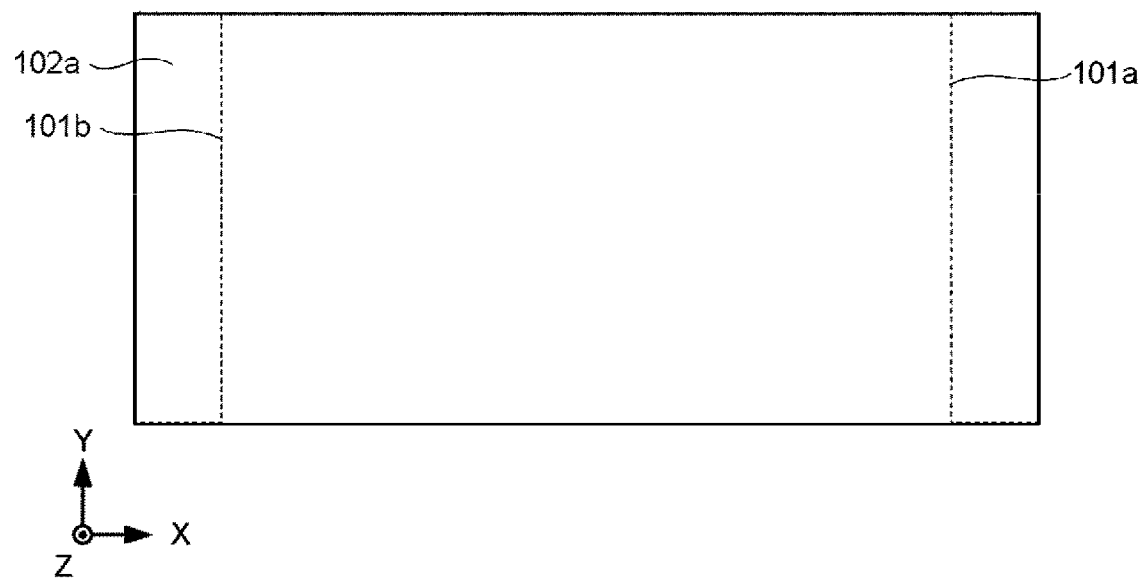
FIGS. 20A and 20B are schematic diagrams illustrating another part of the second example of the method of forming projecting parts.
Figure 20B:
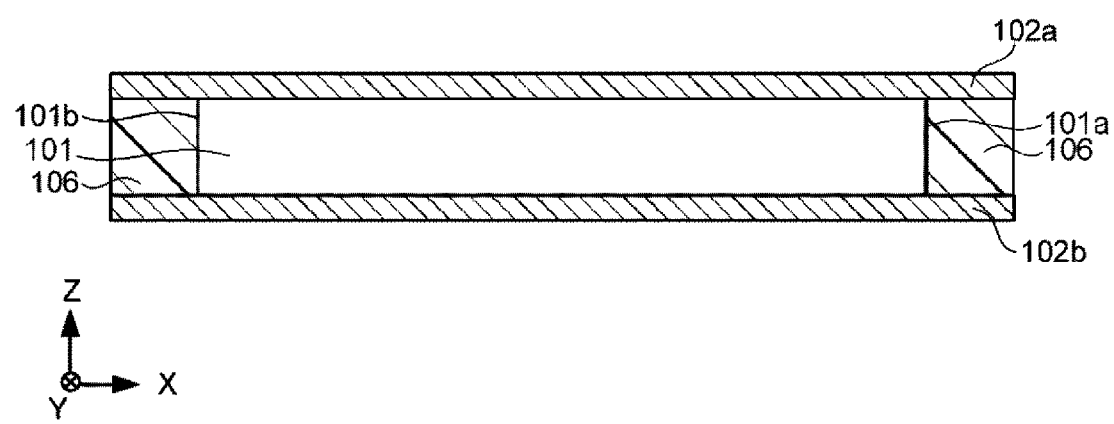

Next, as illustrated in FIGS. 20A and 20B, the interconnection layers 102 are formed on surfaces of at least either the insulating base material 101 or the support material 106. FIGS. 20A and 20B illustrate an example of forming the interconnection layer 102a on the first surfaces of the insulating base material 101 and the support material 106 and forming the interconnection layer 102b on the second surfaces opposite to the first surfaces. The interconnection layers 102 can be formed using a method of, for example, forming conductive materials such as copper plates on the surfaces of the insulating base material 101 and the support material 106.

Figure 21A:
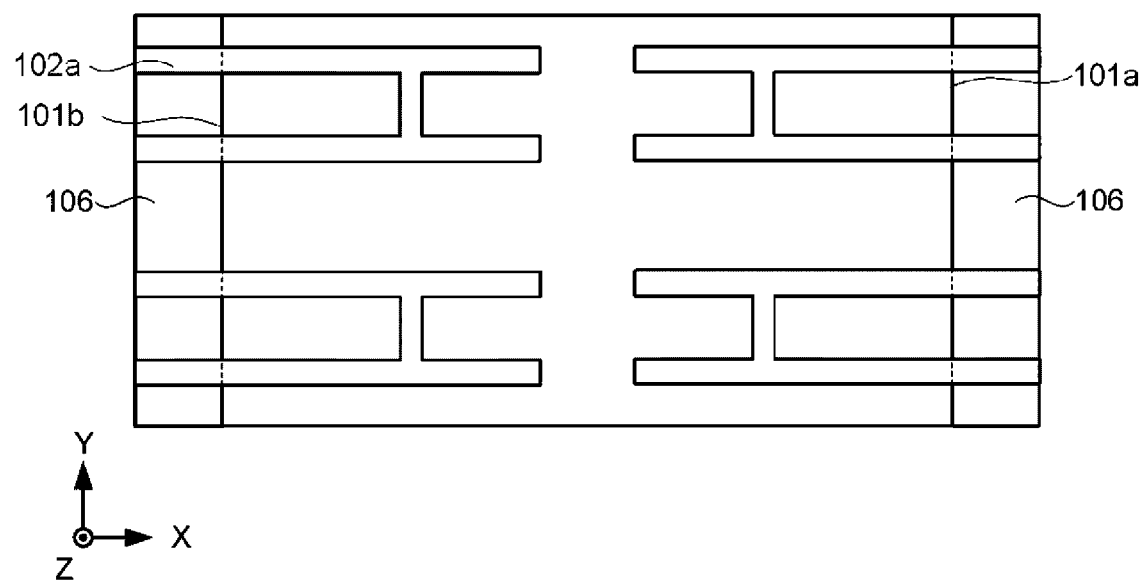
FIGS. 21A and 21B are schematic diagrams illustrating yet another part of the second example of the method of forming projecting parts.
Figure 21B:
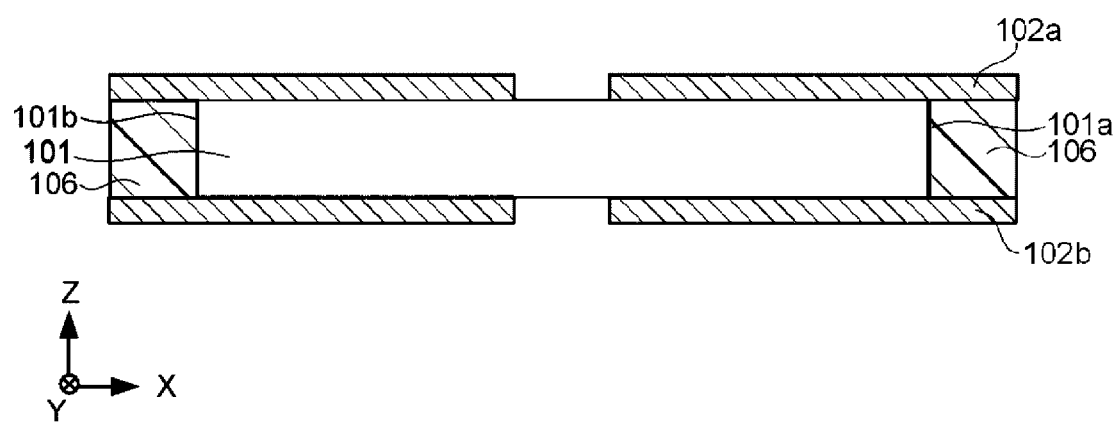

Next, as illustrated in FIGS. 21A and 21B, the interconnection layers 102 are worked to form a plurality of interconnection patterns. A shape of the interconnection pattern is not particularly limited. The interconnection patterns can be formed by, for example, partially removing the interconnection layers 102 using such a method as etching.

Figure 22A:
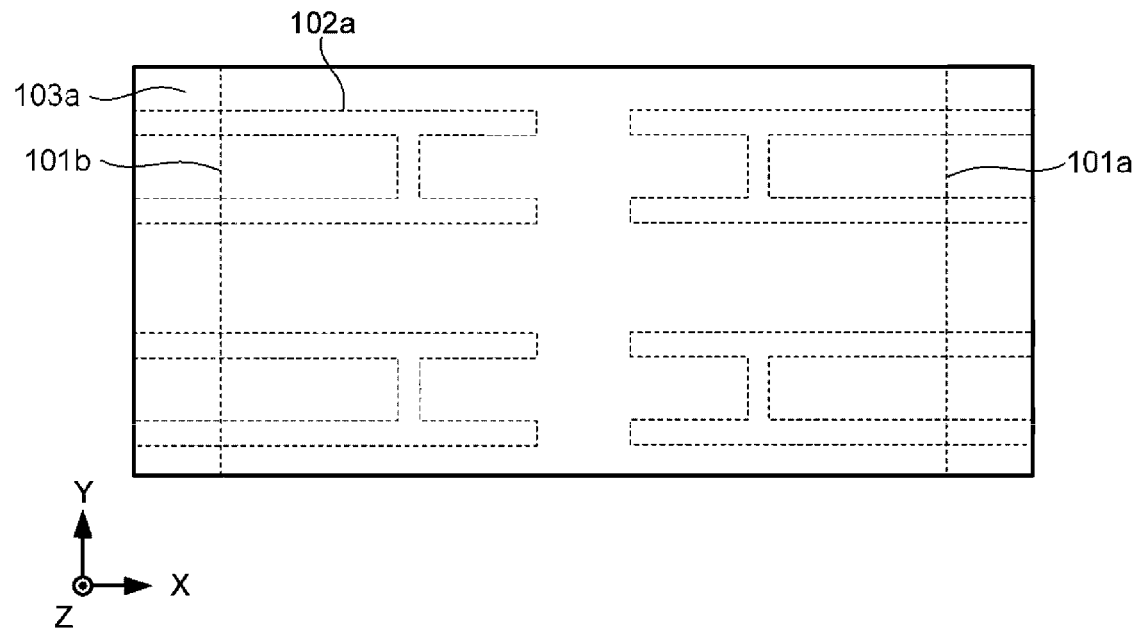
FIGS. 22A and 22B are schematic diagrams illustrating yet another part of the second example of the method of forming projecting parts.
Figure 22B:
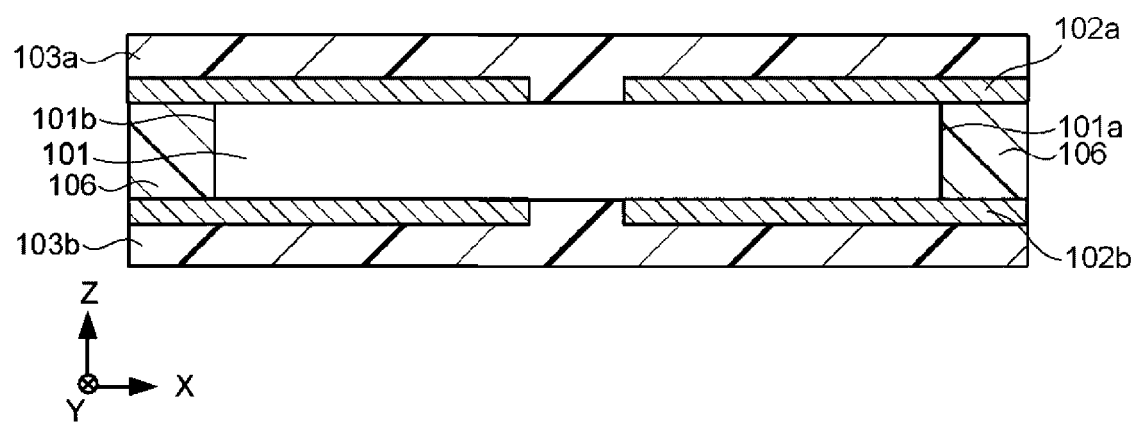

Next, as illustrated in FIGS. 22A and 22B, the insulating layers 103 are formed on the interconnection layers 102. FIGS. 22A and 22B illustrate an example of forming the insulating layer 103a on the interconnection layer 102a and the insulating layer 103b on the interconnection layer 102b. The insulating layers 103 can be formed by coating insulating materials such as solder resists onto the interconnection layers 102.

Figure 23A:
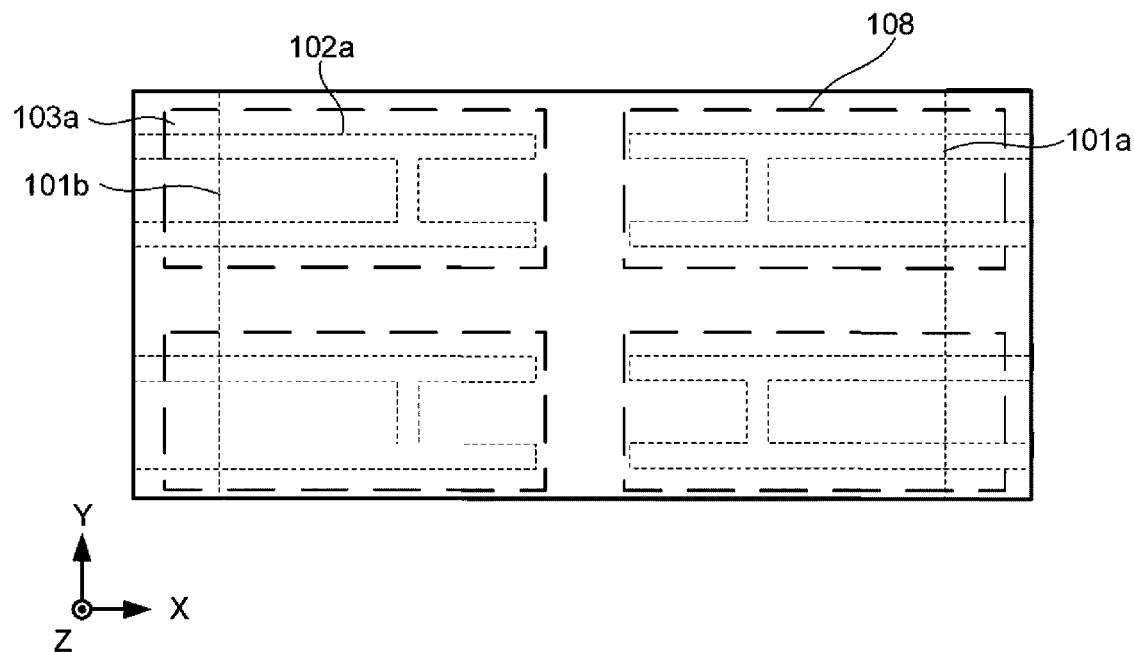
FIGS. 23A and 23B are schematic diagrams illustrating yet another part of the second example of the method of forming projecting parts.
Figure 23B:
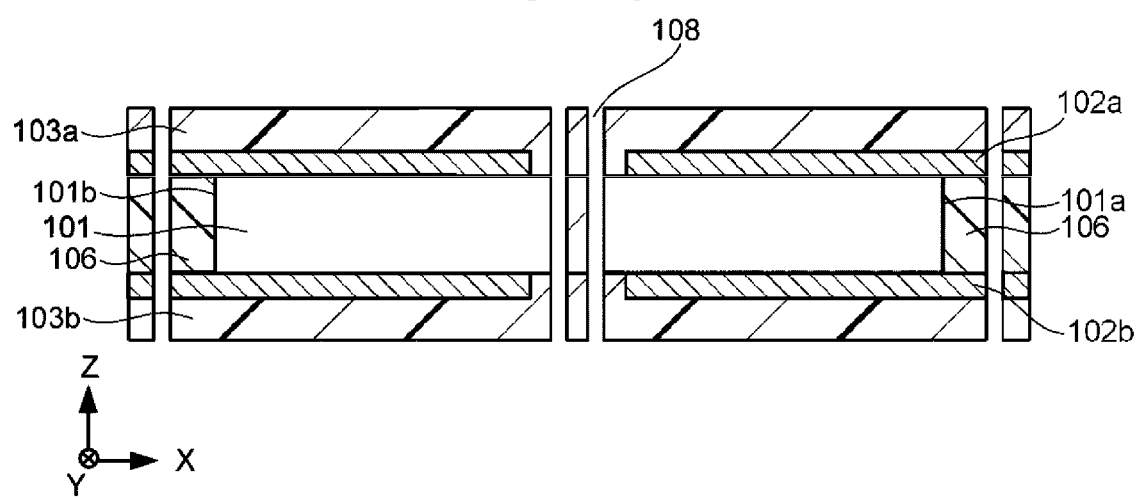

Next, as illustrated in FIGS. 23A and 23B, perforations 108 are formed. The perforations 108 are formed to, for example, delimit a plurality of interconnection patterns. The perforations 108 can be formed by, for example, working a stacked body having the insulating base material 101, the support materials 106, the interconnection layers 102, and the insulating layers 103 in the thickness direction using an instrument such as a drill or a router to form a plurality of openings. At this time, the interconnection patterns are also worked, resulting in damage such as scratches generated on portions of the interconnection layers 102 facing the perforations 108.

Figure 24A:
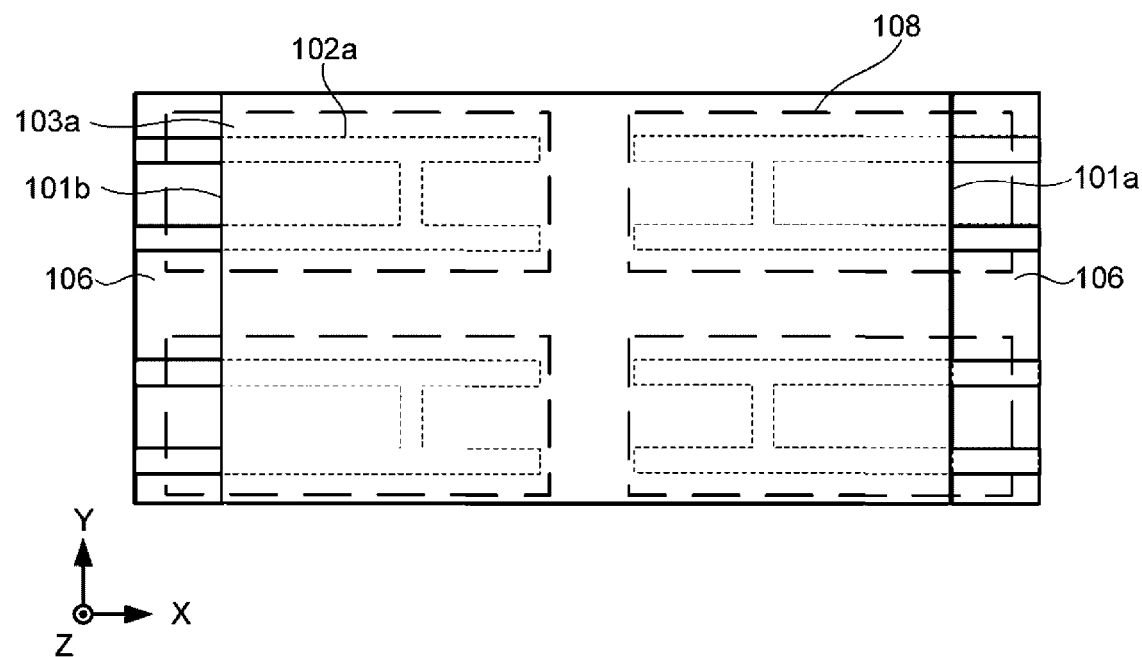
FIGS. 24A and 24B are schematic diagrams illustrating yet another part of the second example of the method of forming projecting parts.
Figure 24B:
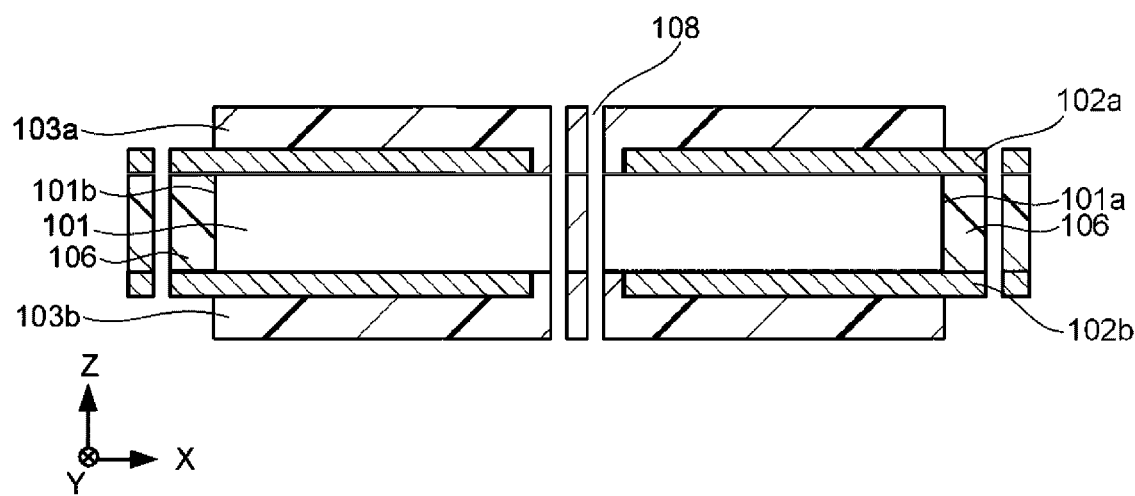

Next, as illustrated in FIGS. 24A and 24B, portions of the insulating layers 103 overlapping the support materials 106 are removed to expose portions of the interconnection layers 102 overlapping the support materials 106. The insulating layers 103 can be removed partially by such a method as etching. In a process of coating the insulating layers 103 onto the interconnection layers 102, the insulating layers 103 may be coated while avoiding the portions that may overlap the support material 106.

Figure 25A:
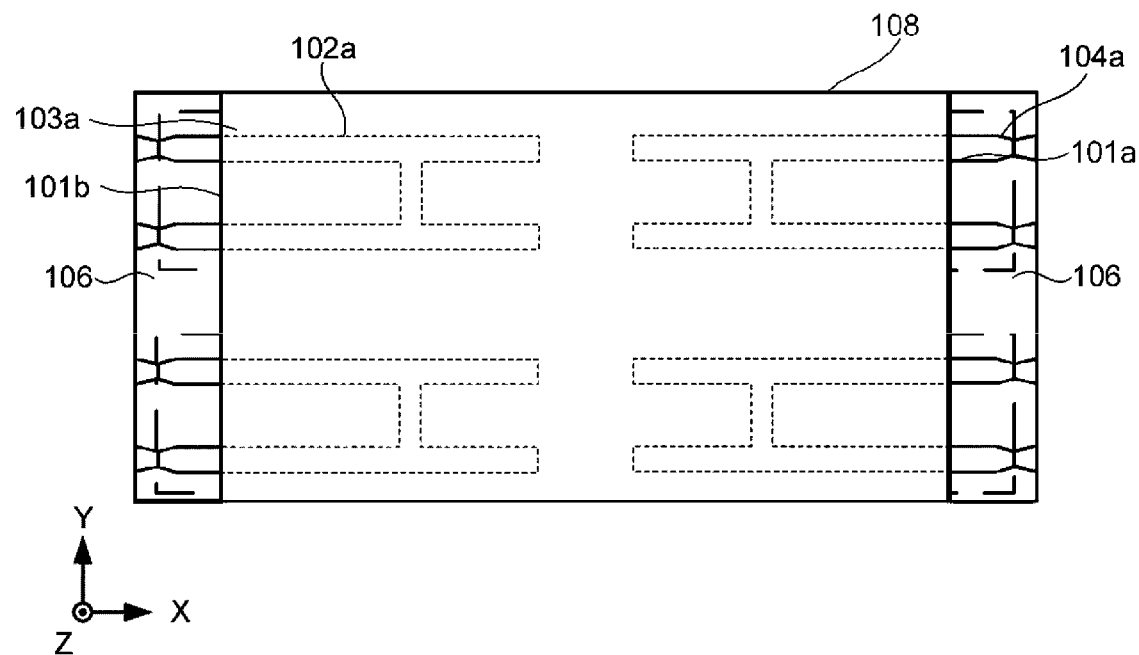
FIGS. 25A and 25B are schematic diagrams illustrating yet another part of the second example of the method of forming projecting parts.
Figure 25B:
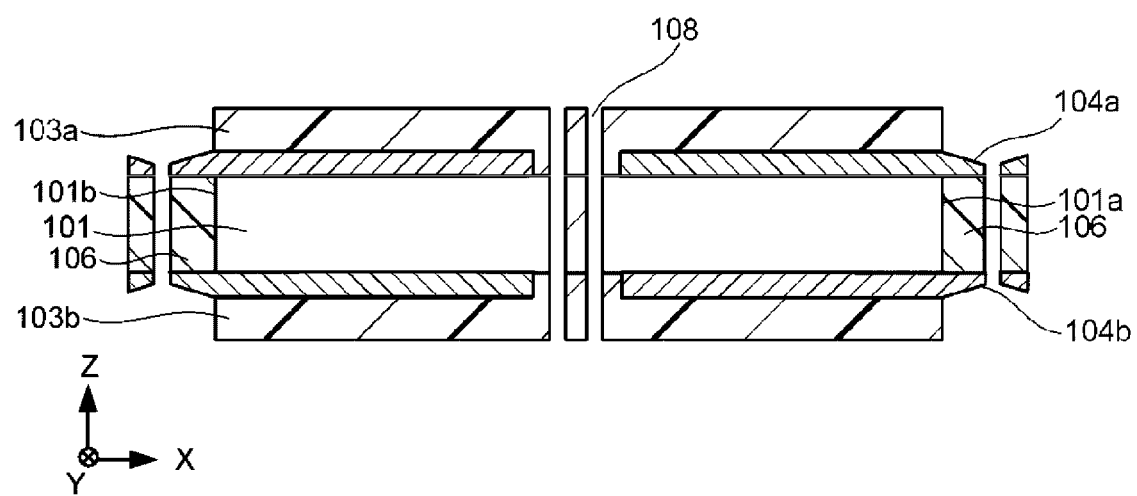

Next, as illustrated in FIGS. 25A and 25B, the exposed portions of the interconnection layers 102 are worked to form the projecting parts 104. FIGS. 25A and 25B illustrate an example of working the exposed portion of the interconnection layer 102a to form the projecting part 104a and working the exposed portion of the interconnection layer 102b to form the projecting part 104b. The projecting parts 104 can be formed by, for example, working the exposed portions of the interconnection layers 102 by electrolytic etching or strong acid etching with an etching solution such as nitric acid. At this time, damaged portions of the interconnection layers 102 are preferentially worked. Furthermore, the support material 106 remains.

Figure 26A:
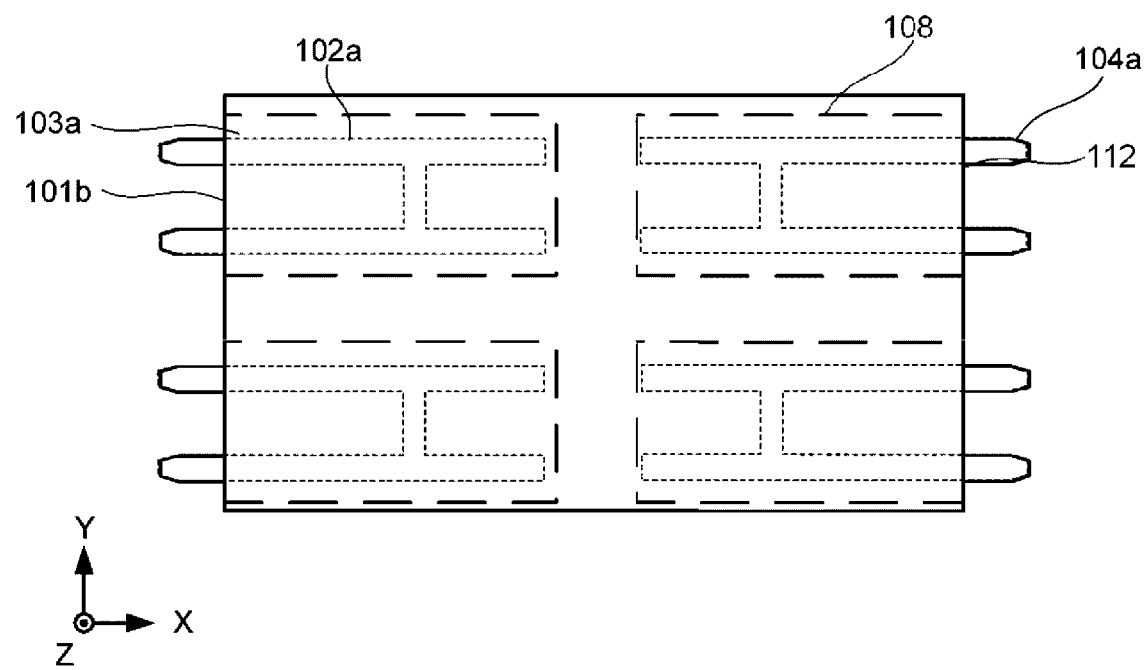
FIGS. 26A and 26B are schematic diagrams illustrating yet another part of the second example of the method of forming projecting parts.
Figure 26B:
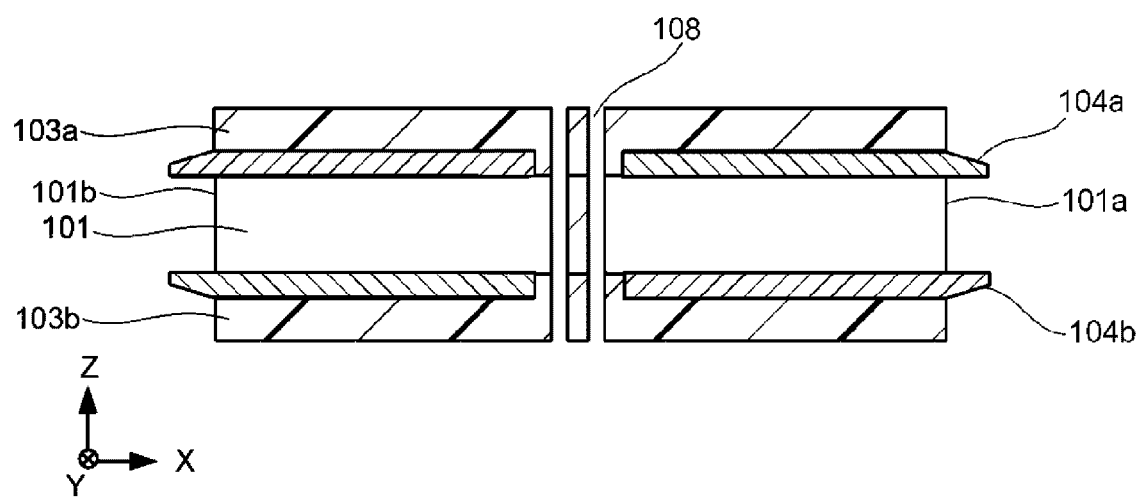

Next, as illustrated in FIGS. 26A and 26B, the support materials 106 are removed. The support material 106 can be removed by, for example, being immersed in an organic solvent. The support material 106 may remain without removal. Subsequently, the interconnection layers 102 are separated along the perforations 108 to form a plurality of wiring boards 10. The above is the description of the second example of the method of forming the projecting parts 104.

Example of Method of Forming Recessed Parts 105

Figure 27A:
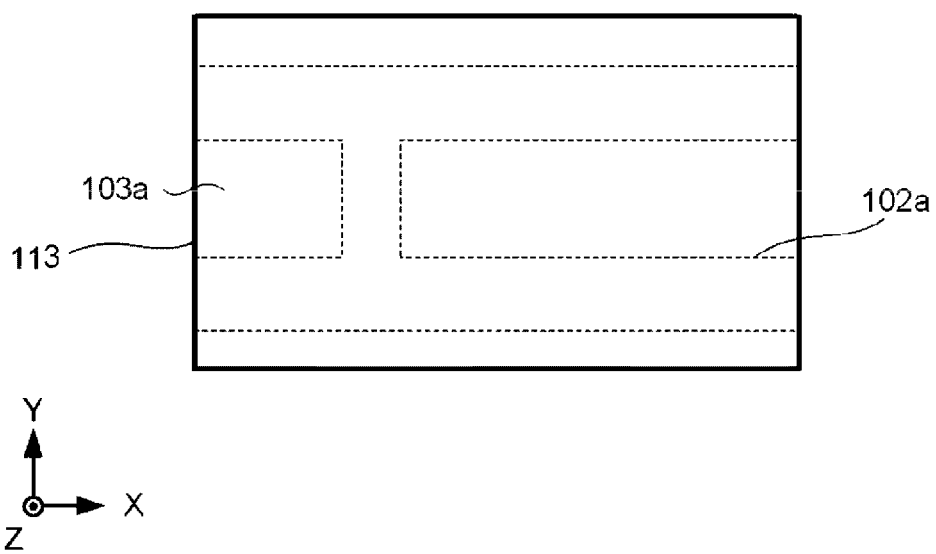
FIGS. 27A and 27B are schematic diagrams illustrating part of an example of a method of forming recessed parts.
Figure 27B:
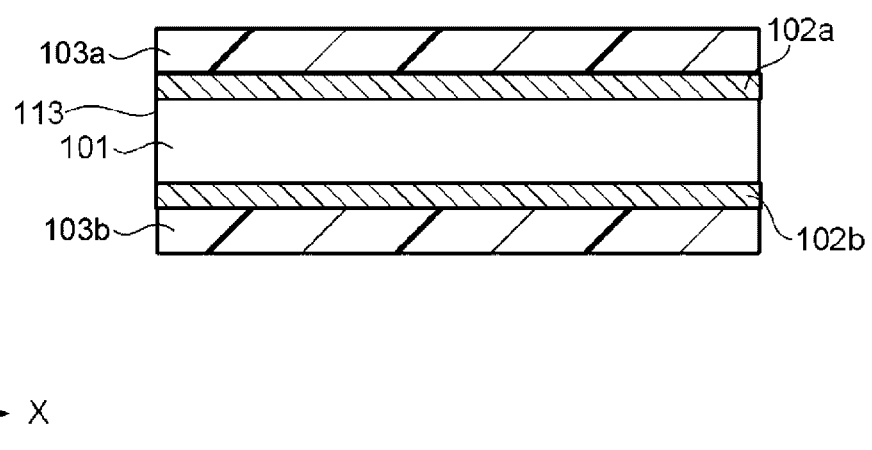
Figure 28A:
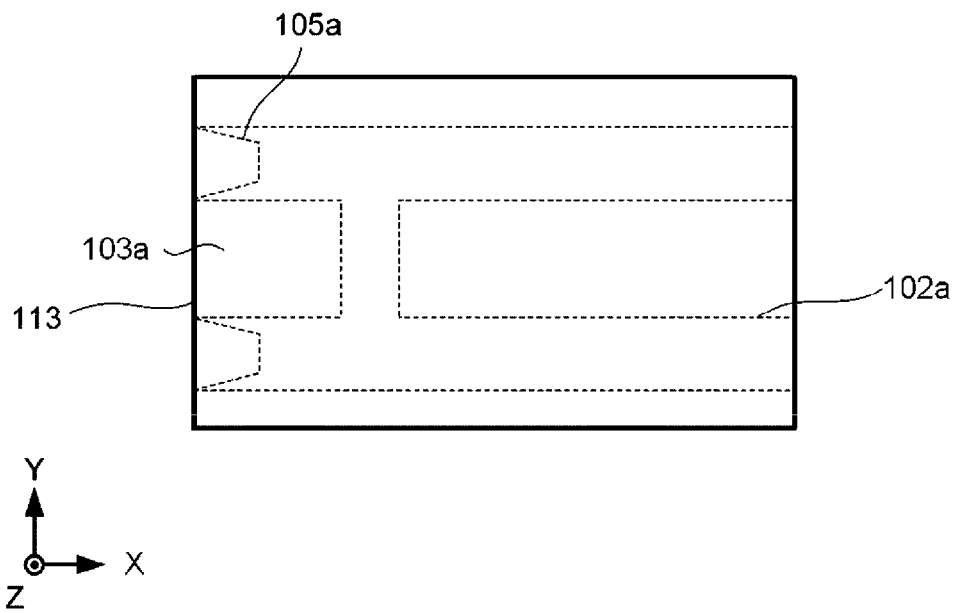
FIGS. 28A and 28B are schematic diagrams illustrating another part of the example of the method of forming recessed parts.
Figure 28B:
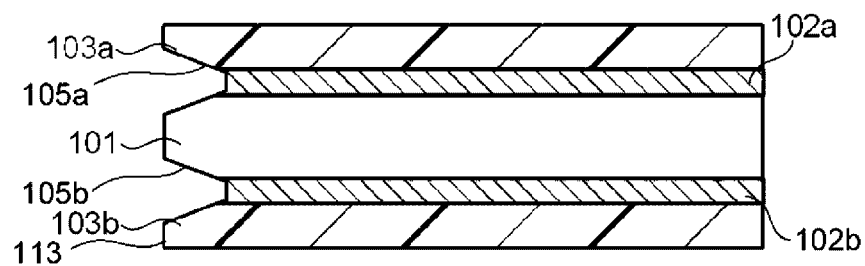

An example of a method of forming the recessed parts 105 provided at the wiring board 10 will be described with reference to FIGS. 27A to 28B. FIGS. 27A to 28B are schematic diagrams illustrating the example of the method of forming the recessed parts 105. FIGS. 27A and 28A are schematic diagrams each illustrating the upper surface of part of the wiring board 10 in a view from the Z-axis direction. FIGS. 27B and 28B are schematic diagrams each illustrating a cross-section of part of the wiring board 10 in a view from the Y-axis direction.

First, as illustrated in FIGS. 27A and 27B, the interconnection layers 102 are formed on the insulating base material 101 and the insulating layers 103 are formed on the interconnection layers 102. The insulating base material 101, the interconnection layers 102, and the insulating layers 103 can be described while appropriately adopting descriptions of the first and second examples of the method of forming the projecting parts 104.

Next, as illustrated in FIGS. 28A and 28B, the side surface 113 is worked to form the recessed parts 105. FIGS. 28A and 28B illustrate an example of forming the recessed parts 105a and 105b on the side surface 113. The recessed parts 105 can be formed by working the side surface 112 along the X-axis direction using, for example, the drill. It is preferable that a diameter of the drill is larger than the width in the Y-axis direction and the width in the Z-axis direction of the projecting parts 104. This enables the recessed parts 105 to function as dust pockets. Therefore, the influence of residues generated when fitting/separating the projecting parts 104 into/from the recessed parts 105 can be prevented, and the number of possible refitting times can be increased. In this occasion, the insulating base material 101 and the insulating layers 103 as well as the interconnection layers 102 may be worked. The above is the description of the example of the method of forming the recessed parts 105. Furthermore, like the second example of the method of forming the projecting parts 104, the recessed parts 105 provided at, for example, the plurality of wiring boards 10 can be formed in the same processes.

First Modification of Wiring Board 10

Figure 29:
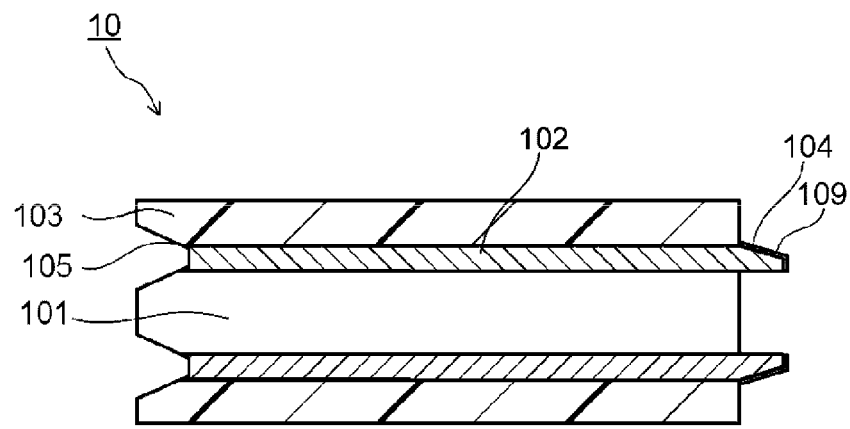
FIG. 29 is a schematic diagram illustrating an example of a first modification of part of the wiring board.
Figure 29:
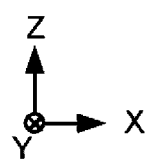
Figure 30:
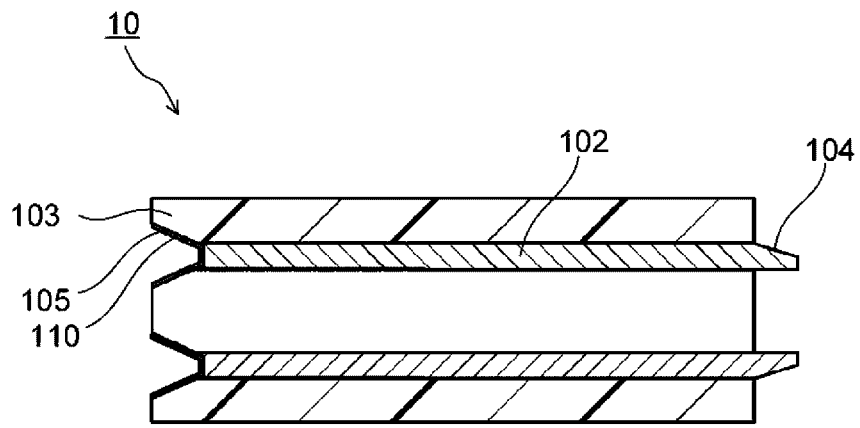
FIG. 30 is a schematic diagram illustrating another example of the first modification of part of the wiring board.
Figure 30:
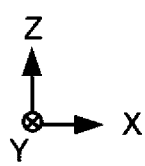

FIG. 29 is a schematic diagram illustrating an example of a first modification of part of the wiring board 10. FIG. 30 is a schematic diagram illustrating another example of the first modification of part of the wiring board 10. FIGS. 29 and 30 illustrate a side surface of the wiring board 10 in a view from the Y-axis direction. The same portions of the wiring board 10 described with reference to FIGS. 2 to 5 are not described.

As illustrated in FIGS. 29 and 30, the first modification of the wiring board 10 has the insulating base material 101, the interconnection layers 102, the insulating layers 103, the projecting parts 104, the recessed parts 105, and at least one of metal films 109 and 110.

The metal film 109 is provided on surfaces of the projecting parts 104. The metal film 110 is provided on surfaces of the recessed parts 105. The metal films 109 or 110 can be formed by, for example, using a method such as an electroless plating method, an evaporation method, or sputtering to deposit a metal material such as copper or gold on the surfaces of the projecting parts 104 or the recessed parts 105. When the evaporation method is used, the metal films 109 and 110 may be formed by evaporating nickel or chromium and then evaporating gold on nickel or chromium.

Figure 31:
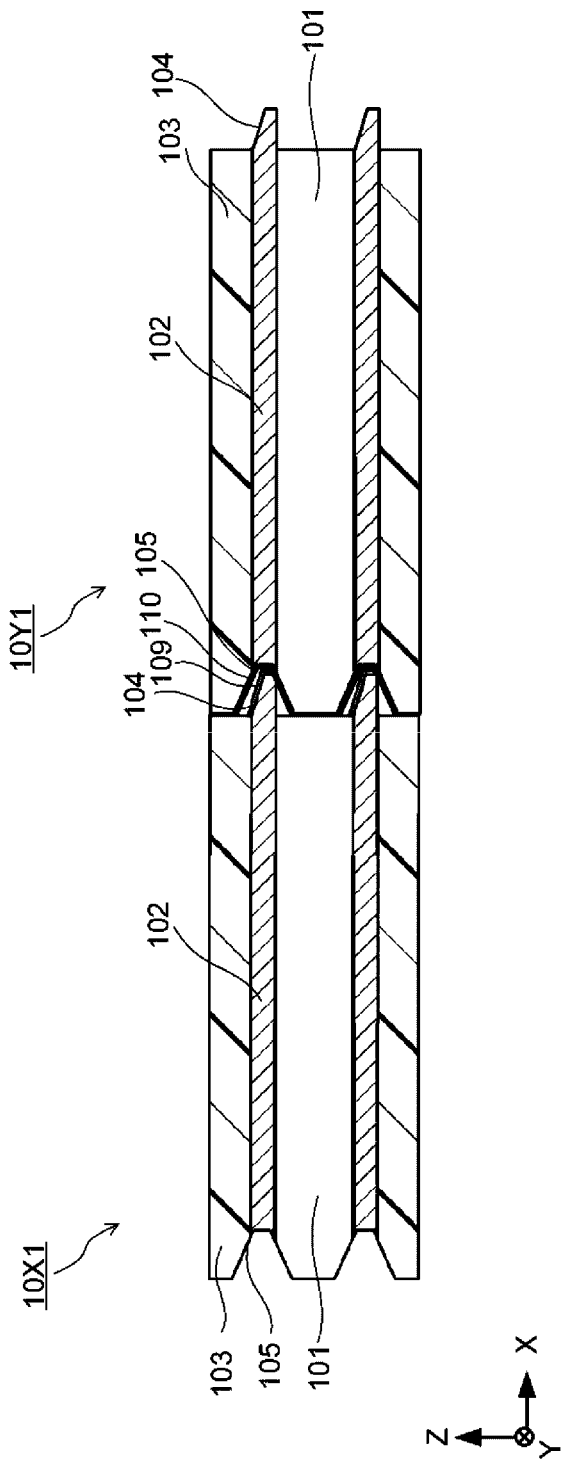
FIG. 31 is a schematic diagram illustrating an example of fitting projecting parts of a wiring board having a metal film into recessed parts of a wiring board having the metal film.

FIG. 31 is a schematic diagram illustrating an example of fitting the projecting parts 104 having the metal film 109 of the wiring board 10 (10X1) into the recessed parts 105 having the metal film 110 of the wiring board 10 (10Y1). Forming the metal film 109 or 110 allows the projecting part 104 of the wiring board 10X1 to be fitted into the recessed part 105 of the wiring board 10Y1 via the metal film 109 or 110, as illustrated in FIG. 31. When a user separates the wiring board 10X1 from the wiring board 10Y1 after factory shipment, at least part of the metal films 109 and 110 may be peeled off. When part of the metal film 109 or 110 is peeled off, the projecting parts 104 may not be electrically connected to the recessed parts 105. In this case, even when the user refits the wiring board 10X1 into the wiring board 10Y1 after the factory shipment, the memory system 1 does not operate because of no electric connection. That is, security of the memory system 1 is expected to improve by providing the metal film 109 or 110.

Figure 32:
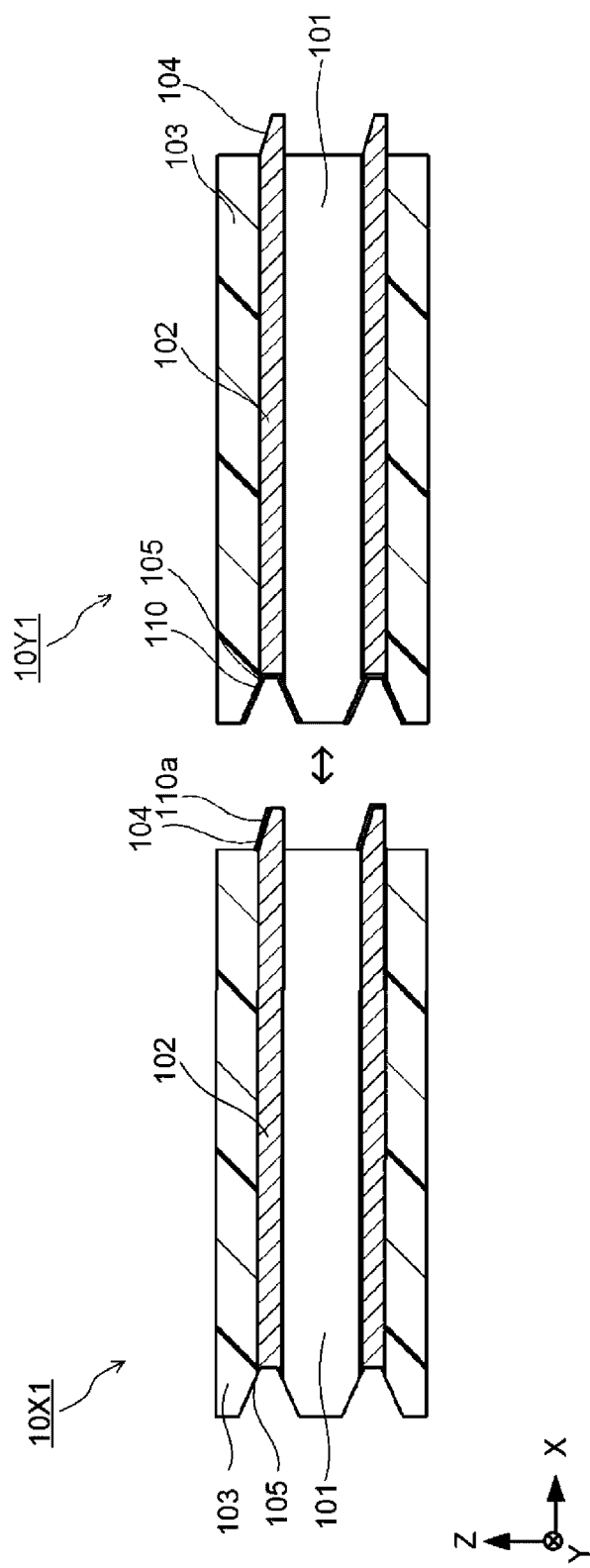
FIG. 32 is a schematic diagram illustrating an example of separating the projecting parts of the wiring board from the recessed parts of the wiring board after fitting.

FIG. 32 is a schematic diagram illustrating an example of separating the projecting parts 104 of the wiring board 10X1 from the recessed parts 105 having the metal film 110 of the wiring board 10Y1 after fitting. When the wiring board 10X1 is separated from the wiring board 10Y1 after fitting the projecting parts 104 of the wiring board 10X1 into the recessed parts 105 of the wiring board 10Y1, residues 110a formed from part of the metal film 110 are often generated on the surfaces of the projecting parts 104. The residues 110a can be used to refit the projecting part 104 into the recessed part 105. Furthermore, setting the width in the Y-axis direction and the width in the Z-axis direction of the recessed parts 105 larger than the width in the Y-axis direction and the width in the Z-axis direction of the projecting parts 104 allows the recessed parts 105 to function as the dust pockets. Therefore, the influence of the residues 110a generated when fitting/separating the projecting parts 104 into/from the recessed parts 105 can be prevented, and the number of possible refitting times can be increased.

Second Modification of Wiring Board 10

Figure 33:
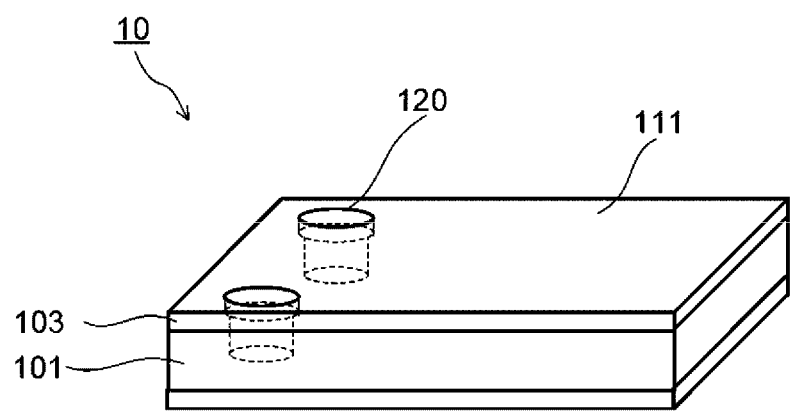
FIG. 33 is a perspective view illustrating a second modification of the wiring board.
Figure 33:
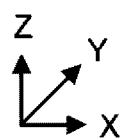

FIG. 33 is a perspective view illustrating a second modification of the wiring board 10. The same portions of the wiring board 10 described with reference to FIGS. 2 to 5 are not described.

The second modification of the wiring board 10 has recessed parts 120 provided at the external surface 111 in addition to the structure illustrated in FIG. 2 or 4, as illustrated in FIG. 33.

The recessed parts 120 function as insertion holes into which a jumper for fixing the plurality of wiring boards 10 is inserted. The recessed parts 120 penetrate the insulating layers 103 and extend to the insulating base material 101 each at a position, for example, where the recessed part 120 does not overlap the interconnection layers 102. The recessed parts 120 are formed by, for example, working the insulating layers 103 and the insulating base material 101 in the thickness direction (Z direction) using an instrument such as the drill after forming the insulating layers 103. The recessed parts 120 are not necessarily through via holes and other electronic components may be mounted on opposite sides to the recessed parts 120.

Figure 34:
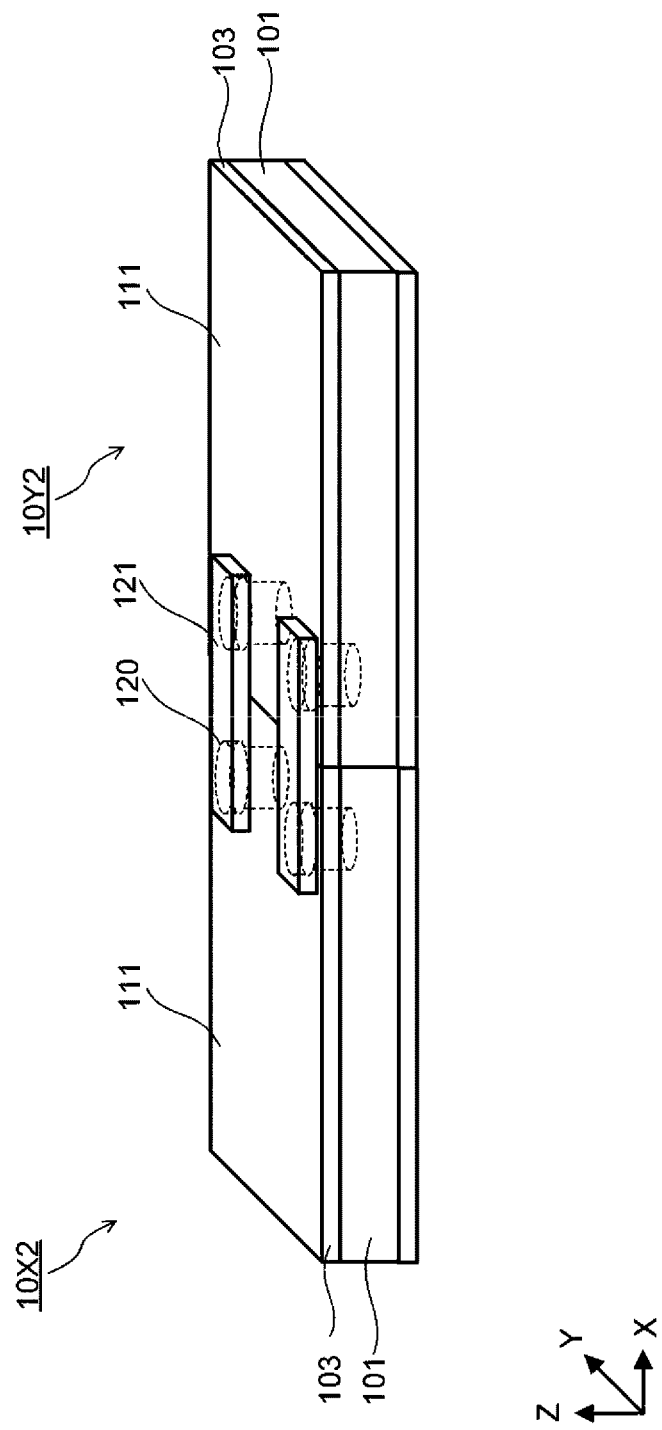
FIG. 34 is a schematic diagram illustrating an example of fixing the wiring board having the recessed parts to the wiring board having the recessed parts using a jumper.

FIG. 34 is a schematic diagram illustrating an example of fixing the wiring board 10 (10X2) having the recessed parts 120 to the wiring board 10 (10Y2) having the recessed parts 120 using jumpers 121. The jumpers 121 are an example of a fixing member that fixes the wiring board 10X2 to the wiring board 10Y2. Although not illustrated in FIG. 34, each of the wiring boards 10 (10X2) and 10 (10Y2) has either the projecting parts 104 or the recessed parts 105. That is, the wiring board 10 (10X2) or 10 (10Y2) is fitted into the counterpart via the projecting parts 104 or the recessed parts 105.

Inserting the jumpers 121 into the recessed parts 120 of the wiring board 10X2 and those of the wiring board 10Y2 enables fixation of the wiring board 10X2 to the wiring board 10Y2. The wiring board 10X2 is separated from the wiring board 10Y2 after detaching the jumpers 121. Using the jumpers 121 can make postures of the wiring boards 10X2 and 10Y2 stable after fitting the projecting parts 104 into the recessed parts 105. This can control unintended and unnecessary separation of the wiring board 10X2 from the wiring board 10Y2.

The jumpers 121 may have insulating properties so that the projecting parts 104 are fitted into the recessed parts 105 to connect the plurality of wiring boards 10 in the memory system 1 according to the embodiment. Furthermore, a plurality of recessed parts 120 may be formed on each of three or more wiring boards 10 to fix the three or more wiring boards 10 to one another using one or a plurality of jumpers 121.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a first wiring board having a first interconnection, a second interconnection, and a first side surface;
a second wiring board having a third interconnection, a fourth interconnection, and a second side surface;
a first projecting part and a second projecting part provided at one of the first side surface and the second side surface, respectively;
a first recessed part and a second recessed part provided at the other of the first side surface and the second side surface, respectively;
a memory mounted on the first wiring board and electrically connected to the first interconnection and the second interconnection; and
a memory controller mounted on the second wiring board and electrically connected to the third interconnection and the fourth interconnection, wherein
the first projecting part is connected to one of the first interconnection and the third interconnection,
the second projecting part is connected to one of the second interconnection and the fourth interconnection,
the first recessed part is connected to the other of the first interconnection and the third interconnection,
the second recessed part is connected to the other of the second interconnection and the fourth interconnection,
the first projecting part is engaged with the first recessed part to electrically connect the memory to the memory controller via the first interconnection and the third interconnection, and
the second projecting part is engaged with the second recessed part to electrically connect the memory to the memory controller via the second interconnection and the fourth interconnection.

2. The memory system according to claim 1, wherein
the first interconnection and the second interconnection are disposed on different layers, and
the third interconnection and the fourth interconnection are disposed on different layers.

3. The memory system according to claim 2, further comprising an insulating base material between the first interconnection and the second interconnection.

4. The memory system according to claim 2, further comprising an insulating layer, the first interconnection and the second interconnection embedded within the insulating layer.

5. The memory system according to claim 2, wherein the first interconnection and the second interconnection include a copper material.

6. The memory system according to claim 1, further comprising:
a metal film disposed on a surface of at least one of the first projecting part, the second projecting part, the first recessed part, and the second recessed part.

7. The memory system according to claim 1, wherein
the second wiring board further has a fifth interconnection, a sixth interconnection, and a third side surface, the fifth interconnection and the sixth interconnection being different from the third interconnection and the fourth interconnection, respectively, and the third side surface being different from the second side surface,
the memory system further comprises:
a third wiring board having a seventh interconnection, an eighth interconnection, and a fourth side surface;
a third projecting part and a fourth projecting part provided at one of the third side surface and the fourth side surface, respectively;
a third recessed part and a fourth recessed part provided at the other of the third side surface and the fourth side surface, respectively; and
a dynamic random access memory mounted on the third wiring board and electrically connected to the fifth interconnection and the sixth interconnection, and wherein
the third projecting part is connected to one of the fifth interconnection and the seventh interconnection,
the fourth projecting part is connected to one of the sixth interconnection and the eighth interconnection,
the third recessed part is connected to the other of the fifth interconnection and the seventh interconnection,
the fourth recessed part is connected to the other of the sixth interconnection and the eighth interconnection,
the third projecting part is engaged with the third recessed part to electrically connect the memory controller to the dynamic random access memory via the fifth interconnection and the seventh interconnection, and
the fourth projecting part is engaged with the fourth recessed part to electrically connect the memory controller to the dynamic random access memory via the sixth interconnection and the eighth interconnection.

8. The memory system according to claim 1, wherein the first wiring board and the second wiring board each include a printed wiring board.

9. The memory system according to claim 1, wherein the first projecting part and the second projecting part are formed of the same material as the first interconnection and the second interconnection.

10. The memory system according to claim 1, wherein the first projecting part and the second projecting part are tapered.

11. The memory system according to claim 1, wherein the memory includes a NAND memory.

12. The memory system according to claim 1, wherein the memory includes dynamic random access memory.

13. The memory system according to claim 1, wherein the memory controller includes a system on chip.

14. The memory system according to claim 1, wherein
the first interconnection and the second interconnection are disposed on the same layer, and
the third interconnection and the fourth interconnection are disposed on the same layer.

15. A wiring board comprising:
a first wiring board having a first interconnection, a second interconnection, and a first side surface, the first and second interconnections being arranged such that a memory is mountable on the first wiring board;
a second wiring board having a third interconnection, a fourth interconnection, and a second side surface, the third and fourth interconnections being arranged such that a memory controller is mountable on the second wiring board;
a first projecting part and a second projecting part provided at the first side surface or the second side surface, respectively; and
a first recessed part and a second recessed part provided at the other of the first side surface or the second side surface, respectively, wherein
the first projecting part is connected to one of the first interconnection and the third interconnection,
the second projecting part is connected to one of the second interconnection and the fourth interconnection,
the first recessed part is connected to the other of the first interconnection and the third interconnection,
the second recessed part is connected to the other of the second interconnection and the fourth interconnection,
the first projecting part is engaged with the first recessed part to enable electrical connection of the first interconnection to the third interconnection, and
the second projecting part is engaged with the second recessed part to enable electrical connection of the second interconnection to the fourth interconnection.

16. The wiring board according to claim 15, wherein
the first interconnection and the second interconnection are disposed on different layers, and
the third interconnection and the fourth interconnection are disposed on different layers.

17. The wiring board according to claim 15, further comprising:
a metal film disposed on a surface of at least one of the first projecting part, the second projecting part, the first recessed part, and the second recessed part.

18. The wiring board according to claim 15, wherein the first projecting part and the second projecting part are formed of the same material as the first interconnection and the second interconnection.

19. The wiring board according to claim 15, wherein the first projecting part and the second projecting part are tapered.

20. The wiring board according to claim 15, wherein
the first interconnection and the second interconnection are disposed on the same layer, and
the third interconnection and the fourth interconnection are disposed on the same layer.

* * * * *